United States Patent
Shi

(10) Patent No.: US 9,213,182 B2
(45) Date of Patent: Dec. 15, 2015

(54) ASYMMETRIC OVERLAP AND SUSPENDED SHUTTER STRUCTURE

(71) Applicant: Pixtronix, Inc., San Diego, CA (US)

(72) Inventor: Jianru Shi, Haverhill, MA (US)

(73) Assignee: Pixtronix, Inc., San Diego, CA (US)

( * ) Notice: Subject to any disclaimer, the term of this patent is extended or adjusted under 35 U.S.C. 154(b) by 350 days.

(21) Appl. No.: 13/745,408

(22) Filed: Jan. 18, 2013

(65) Prior Publication Data

US 2014/0204096 A1 Jul. 24, 2014

(51) Int. Cl.
*G02B 26/02* (2006.01)
*G06T 1/00* (2006.01)
*B81B 3/00* (2006.01)
*G02B 27/00* (2006.01)

(52) U.S. Cl.
CPC . *G02B 26/02* (2013.01); *B81B 3/00* (2013.01); *G02B 26/023* (2013.01); *G02B 27/0018* (2013.01); *G06T 1/00* (2013.01); *Y10T 29/49826* (2015.01)

(58) Field of Classification Search
None
See application file for complete search history.

(56) References Cited

U.S. PATENT DOCUMENTS

| | | |
|---|---|---|
| 2007/0216987 A1 | 9/2007 | Hagood et al. |
| 2011/0043882 A1 | 2/2011 | Yoon et al. |
| 2011/0080538 A1 | 4/2011 | Shiota et al. |
| 2012/0019713 A1 | 1/2012 | Gudlavalleti et al. |
| 2012/0154455 A1 | 6/2012 | Steyn et al. |

FOREIGN PATENT DOCUMENTS

| | | |
|---|---|---|
| CN | 101995655 A | 3/2011 |
| WO | WO-2012018483 A1 | 2/2012 |

OTHER PUBLICATIONS

International Search Report and Written Opinion in International Patent Application PCT/US2014/011270 dated Apr. 17, 2014.
Taiwan Office Action and Search Report for Taiwan Application No. TW103101488 dated Oct. 23, 2014.
Taiwanese Office Action—TW103101488—TIPO—Oct. 23, 2014.

*Primary Examiner* — Maurice L McDowell, Jr.
(74) *Attorney, Agent, or Firm* — Weaver Austin Villeneuve & Sampson, LLP

(57) ABSTRACT

Systems and methods for displays that have a moveable shutter formed on a substrate having an aperture. The shutter, in at least one position, is asymmetrically aligned over the aperture. The asymmetric alignment provides an overlap between shutter and the substrate on one side of the aperture that is larger than an overlap between the shutter and the substrate on another side of the aperture. Typically, the larger overlap increases the ability of the shutter to reduce light passing through the aperture when then shutter is the in the at least one position.

16 Claims, 13 Drawing Sheets

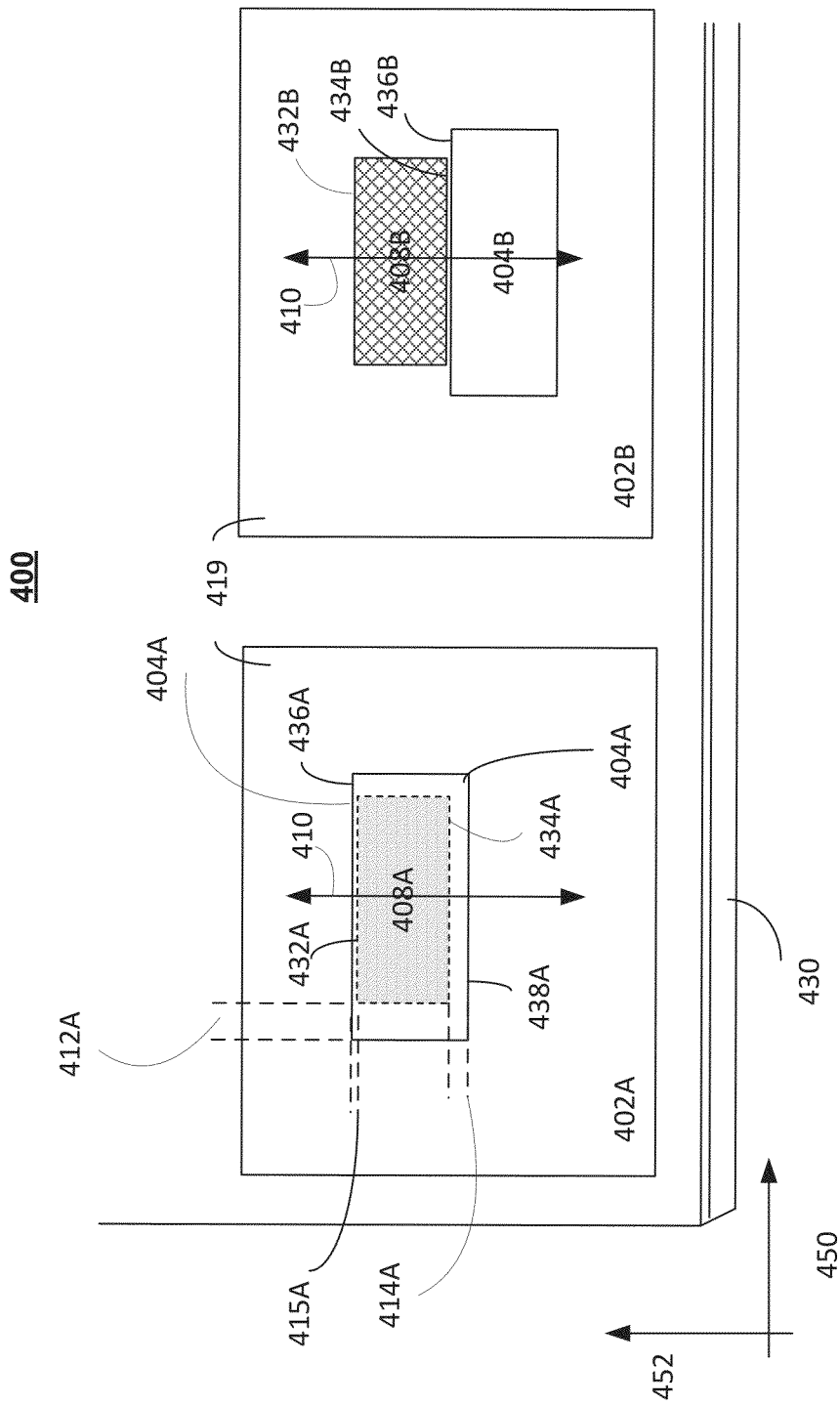

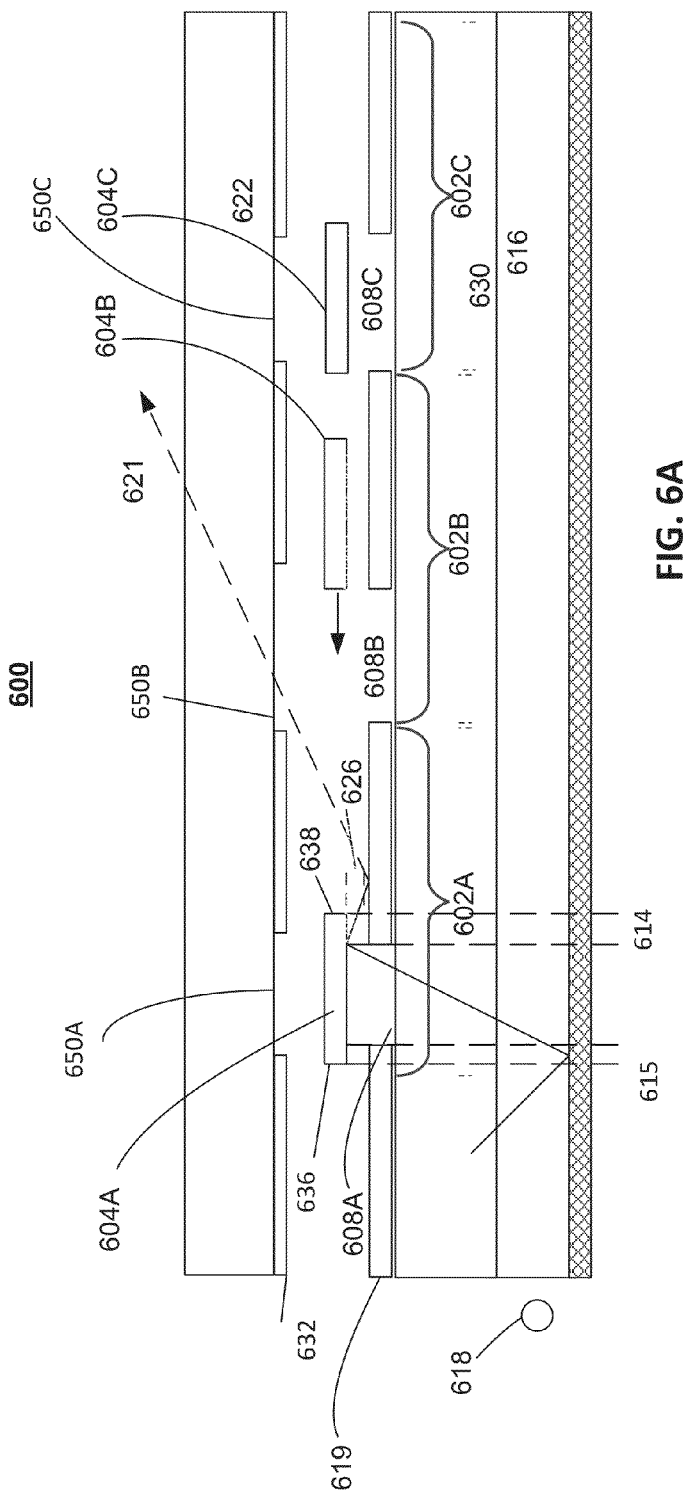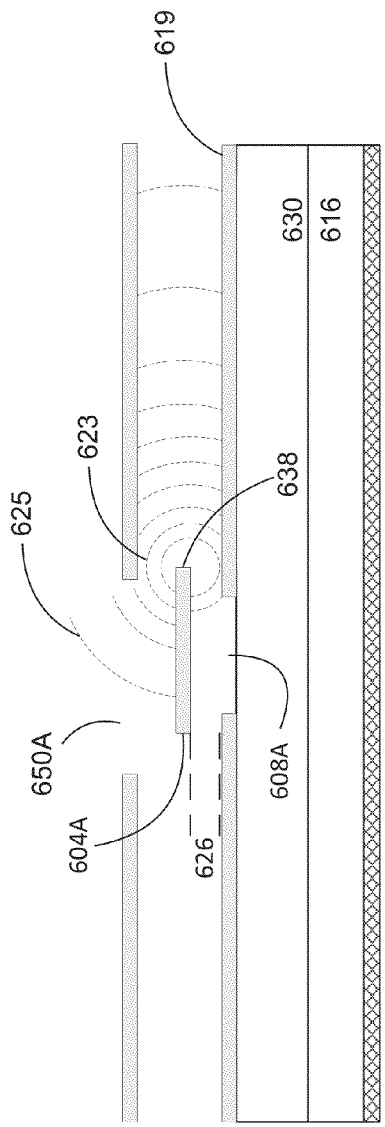
FIG. 6A
FIG. 6B

ASYMMETRIC OVERLAP AND SUSPENDED SHUTTER STRUCTURE

TECHNICAL FIELD

The field is displays, and more particularly displays with microelectromechanical systems shutters.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

In a conventional digital microelectromechanical shutter display, a plurality of MEMS shutters are laid out in a grid. Each shutter is capable of blocking or passing light by moving over or away from an aperture. Each shutter and aperture acts as a pixel in the display. The operation of the shutters is controlled by an actuator which moves the shutters to block or pass light and thereby create an image on the display.

In this conventional design, there are typically two apertures, one positioned above the other, and the shutter is positioned between the two apertures. The actuator can drive the shutter to a position between the two apertures to block light from traveling between the two apertures. Alternatively, the actuator can move the shutter away from the apertures and allow light to pass from one aperture to the other. The position and size of the shutter and the apertures can affect how light passes from one aperture to another and affect the properties of the display.

Although these conventional displays work quite well, it would be beneficial to the art to improve how the shutter and apertures pass light to improve the properties of a displayed image.

SUMMARY

The systems, methods and devices of this disclosure each have several innovative aspects, no single one of which is solely responsible for the desirable attributes disclosed.

One innovative aspect of the subject matter described in this disclosure can be implemented in a display including a substrate having an aperture with a first side spaced apart from a second side, and a shutter for obstructing passage of light through the aperture and having a first edge spaced apart from a second edge, and, in a first position, aligned with the aperture to have the first shutter edge extending a length past the first side of the aperture and the second shutter edge extending a second longer length past the second side of the aperture.

In some implementations, the display can include an actuator for moving the shutter between the first position and a second position, wherein moving the shutter to the second position causes the first edge of the shutter to traverse the aperture.

In some implementations, the display can include a second layer of material disposed on a side of the shutter opposite the substrate and defining a second aperture aligned with the aperture in the substrate such that a portion of the second aperture is coextensive with the aperture in the substrate. In some embodiments the second aperture may be laterally offset from the aperture in the substrate to be asymmetrically aligned with the aperture in the substrate and extend further toward the second edge of the shutter. In some embodiments, the second layer of material may have a peripheral edge laterally spaced away from the aperture in the substrate and defining the aperture to extend from the peripheral edge to substantially a terminal edge of a shutter assembly formed on the substrate.

In some implementations, the first position of the display can align the shutter with the aperture to block passage of light through the aperture and wherein the second position aligns the shutter with the aperture to allow light to pass through the aperture.

In some implementations of the display when the shutter is in the second position, a portion of the shutter can extend across the aperture.

In some implementations, the display includes a light cavity disposed opposite the substrate and arranged to pass light toward the aperture.

In some implementations, the display can have a substrate that includes a plurality of apertures, each having a respective shutter and a respective actuator for moving the shutter between the first position and a second position. In some implementations, the display one of the plurality of shutters moves in a first direction of motion from the first position to the second position and a second different shutter moves along in a different direction of motion from the first position to the second position.

In some implementations, the display may include a processor that is configured to communicate with the display, the processor being configured to process image data, and a memory device that is configured to communicate with the processor.

In some implementations, the display may include a driver circuit configured to send at least one signal to the display, and a controller configured to send at least a portion of the image data to the driver circuit.

In some implementations, the display may include an image source module configured to send the image data to the processor, wherein the image source module includes at least one of a receiver, transceiver, and transmitter.

In some implementations, the display may include an input device configured to receive input data and to communicate the input data to the processor.

Another innovative aspect of the subject matter disclosed herein may be implemented in methods of manufacturing a display, including providing a substrate having an aperture with a first side spaced apart from a second side, disposing proximate the aperture, a moveable shutter having a first edge spaced apart from a second edge and being arranged on the substrate for traversing a path proximate the aperture to a first position for obstructing passage of light through the aperture, and when in the first position, aligning the shutter with the aperture to have the first shutter edge extending a length past the first side of the aperture and the second shutter edge extending a second longer length past the second side of the aperture.

In some implementations methods may include providing an actuator for moving the shutter between the first position and a second position, wherein moving the shutter to the second position causes the first edge of the shutter to traverse the aperture.

In some implementations methods may include providing a second layer of material disposed on a side of the shutter opposite the substrate and defining a second aperture aligned with the aperture in the substrate such that a portion of the second aperture is coextensive with the aperture in the substrate.

In some implementations methods may include spacing the second aperture laterally from the aperture in the substrate to asymmetrically align with the aperture in the substrate and extend further toward the second edge of the shutter.

In some implementations methods may include a second layer of material that can have a peripheral edge laterally spaced away from the aperture in the substrate to define the aperture to extend from the peripheral edge to substantially a terminal edge of a shutter assembly formed on the substrate.

The methods may include forming the aperture to extend across the shutter when the shutter is in the second position.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays (LCDs), organic lighting-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

The foregoing discussion will be understood more readily from the following detailed description with reference to the following drawings

FIG. 4 is an overhead view of a MEMS-based shutter in a first position and a MEMS-based shutter in a second position.

FIG. 6A is a cross-sectional view of light from a light source passing through a gap between an aperture and a shutter.

FIG. 6B is a pictorial representation of a pattern of diffracting light passing around an edge of a shutter.

DETAILED DESCRIPTION OF THE DRAWINGS

Figure 1A:
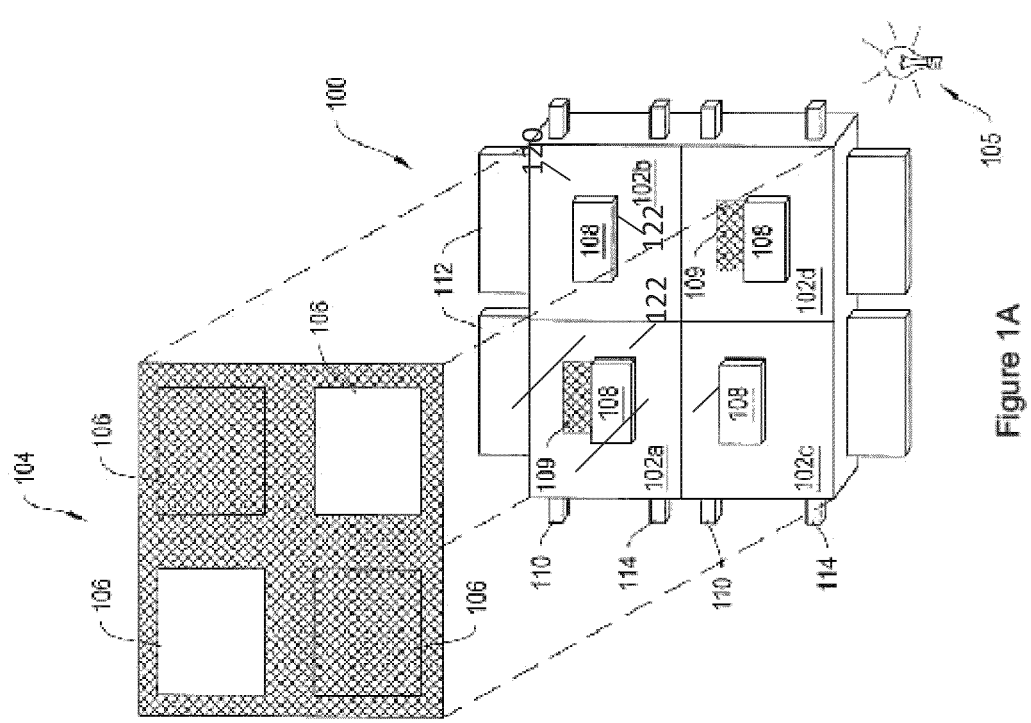
FIG. 1A is an isometric view of an example display apparatus.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

The systems and methods described herein include, among other things, MEMS light modulators that include a shutter that moves over and away from an aperture formed in a substrate. In one implementation, the shutter moves between an open position wherein the shutter is laterally spaced away from the aperture and a closed position wherein the shutter is aligned over the aperture. The shutter moves over and away from the aperture to block or pass light that is traveling through the aperture. The shutter travels along a path that is transverse to the aperture and moves in a first direction of motion from the open position to the closed position and moves in the reverse direction to move from the closed position to the open position. The shutter has a leading edge and a trailing edge. As the shutter moves between the open and closed positions, the leading edge of the shutter travels over the aperture and the trailing edge of the shutter moves toward the aperture, but does not travel over the aperture. In one implementation, the shutter, when in the closed position, is asymmetrically aligned over the aperture to position the trailing edge of the shutter a larger distance from the aperture than the leading edge of the shutter is positioned from the aperture.

In some implementations, the MEMS light modulator may include a second aperture. The shutter may be disposed between the aperture in the substrate and the second aperture and may move between the open and the closed positions to modulate light passing between these two apertures. The apertures are aligned relative to each other to allow light to pass from one aperture to the other. In one implementation, the second aperture has a first side and a second side, and the second side is proximate the shutter when in the shutter is in the open position. The second side of the aperture may extend further from the center of the second aperture than the first side, to arrange the second aperture asymmetrically with the aperture in the substrate.

In some implementations, the aperture in the substrate has a first side and a second side and the second side is proximate the shutter when in an open position. In some implementations, the second side of the aperture in the substrate extends past the leading edge of the shutter when the shutter is in the open position.

Particular implementations of the subject matter described in this disclosure can be implemented to realize one or more of the following potential advantages.

The systems and methods described herein may provide improved contrast ratios by providing an extended shutter that reduces light leakage effects, including light diffraction and reflection effects that may arise from light escaping from beneath a closed shutter. The shutter may be extended so that the trailing edge of shutter is positioned a further distance from the aperture than in a conventional shutter. This extends the length of the shutter and provides a larger shutter for blocking light passing through the aperture. Additionally, by extending the shutter to dispose the trailing edge further away from the aperture, but having the leading edge of the shutter maintain a conventional position relative to the aperture, the time to move the leading edge of the shutter across the aperture is maintained. Thus, the ability of the shutter to block light is improved without altering the time required to switch the shutter between the open and closed positions.

The systems and methods described herein, in some implementations, may also increase viewing angles by extending the length of the aperture above the shutter, to have the aperture extend further toward the trailing edge of the shutter. The extended aperture increases the range of angles along which light can travel, when passing from the aperture in the substrate to the aperture above the shutter. The extended aperture above the shutter improves the viewing angle on the side of the aperture toward the trailing edge.

In one implementation, the systems and methods disclosed may also increase viewing angles by extending the length of the aperture in the substrate toward the trailing edge of the shutter. By extending the aperture in the substrate, more space is provided for light to pass through the substrate. Moreover, the extended aperture increases the aperture's ability to pass light that is traveling at a high viewing angle along a path between the extension of the aperture in the substrate and the opposing side of the aperture above the shutter. The extended aperture below the shutter improved the viewing angle on the side of the aperture toward the leading edge of the shutter.

FIG. 1A is an isometric view of an example display apparatus and presents a schematic diagram of an example direct-view MEMS-based display apparatus 100. The display apparatus 100 includes a plurality of light modulators 102a-102d (generally "light modulators 102") arranged in rows and columns. In the display apparatus 100, light modulators 102a and 102d are in the open state, allowing light to pass. Light modulators 102b and 102c are in the closed state, obstructing the passage of light. By selectively setting the states of the light modulators 102a-102d, the display apparatus 100 can form an image 104. For a backlit display, the light modulators 102 block light from the lamp or lamps 105. In other implementations, the display apparatus 100 may form an image by reflection of ambient light originating from the front of the display apparatus 100, or the display apparatus 100 may form an image by reflection of light from a lamp or lamps 105 positioned in the front of the display apparatus 100, i.e. by use of a frontlight. In either case, the closed or open states of the light modulators 102 modulate light in an optical path by, for example, and without limitation, blocking, reflecting, absorbing, filtering, polarizing, diffracting, or otherwise altering a property or path of the light.

In the depicted display apparatus 100, each light modulator 102 corresponds to a pixel 106 in the image 104. In other implementations, the display apparatus 100 may utilize a plurality of light modulators 102 to form a pixel 106 in the image 104. For example, the display apparatus 100 may include three color-specific light modulators 102. By selectively opening one or more of the color-specific light modulators 102 corresponding to a particular pixel 106, the display apparatus 100 can generate a color pixel 106 in the image 104. In this embodiment using these color-specific light modulators 102, a pixel 106 in image 104 will include the three pixels 106 associated with the three light modulators 102 that produce the three colors of the color pixel 106. In another example, the display apparatus 100 includes two or more light modulators 102 per pixel 106 to provide grayscale in an image 104.

Display apparatus 100 is a direct-view display in that it does not require imaging optics. The user sees an image by looking directly at the display apparatus 100. In alternate implementations the display apparatus 100 is incorporated into a projection display. In such implementations, the display forms an image by projecting light onto a screen or onto a wall.

Direct-view displays may operate in either a transmissive or reflective mode. In a transmissive display, the light modulators filter or selectively block light which originates from a lamp or lamps positioned behind the display. The light from the lamps is optionally injected into a light guide or "backlight". Transmissive direct-view display implementations are often built onto transparent or glass substrates to facilitate a sandwich assembly arrangement where one substrate, containing the light modulators, is positioned directly on top of the backlight. In some transmissive display implementations, a color-specific light modulator is created by associating a color filter material with each light modulator 102. In other transmissive display implementations colors can be generated, as described below, using a field sequential color method by alternating illumination of lamps with different primary colors.

Each of the depicted light modulators 102 includes a shutter 108 and an aperture 109. Each shutter 108 has a leading edge 120 and a trailing edge 122. To illuminate a pixel 106 in the image 104, the shutter 108 is positioned away from the aperture, being laterally spaced from the aperture 109 such that light passes through the aperture 109 towards a viewer. To keep a pixel 106 unlit, the shutter 108 is positioned to another different position such that the shutter 108 is aligned with the aperture 109 and obstructs the passage of light through the aperture 109. The aperture 109 is defined by an opening patterned through a reflective or light-absorbing material that may be a film laid on to a transparent substrate. Light modulators 102A and 102B present a side-by-side comparison of a shutter 108 in an open position, shown by light modulator 102A, and a shutter 108 in a closed position, show by light modulator 102B. The depicted side-by-side comparison illustrates that the shutter 102B closes by moving the leading edge 120 across the aperture 109 to obstruct the passage of light through the aperture 109.

The display apparatus 100 also includes a control matrix connected to the substrate and to the light modulators 102 for controlling the movement of the shutters 108. The control matrix includes a series of electrical interconnects (e.g., interconnects 110, 112, and 114), including at least one write-enable interconnect 110 (also referred to as a "scan-line interconnect") per row of pixels, one data interconnect 112 for each column of pixels, and one common interconnect 114 providing a common voltage to all pixels, or at least to pixels from both multiple columns and multiples rows in the display apparatus 100. In response to the application of an appropriate voltage (the "write-enabling voltage, $V_{we}$"), the write-enable interconnect 110 for a given row of pixels prepares the pixels in the row to accept new shutter movement instructions. The data interconnects 112 communicate the new movement instructions in the form of data voltage pulses. The data voltage pulses applied to the data interconnects 112, in some implementations, directly contribute to an electrostatic movement of the shutters. In other implementations, the data voltage pulses control switches, e.g., transistors or other non-linear circuit elements that control the application of separate actuation voltages, which are typically higher in magnitude than the data voltages, to the light modulators 102. The application of these actuation voltages then results in the electrostatic driven movement of the shutters 108, moving the shutters 108 from a first position to a second position. In certain implementations, this moves a shutter 108 from an open position to a closed position. But in other implementations, the actuation voltage may drive the shutter between first and second positions that are intermediate between open and closed.

Figure 1B:
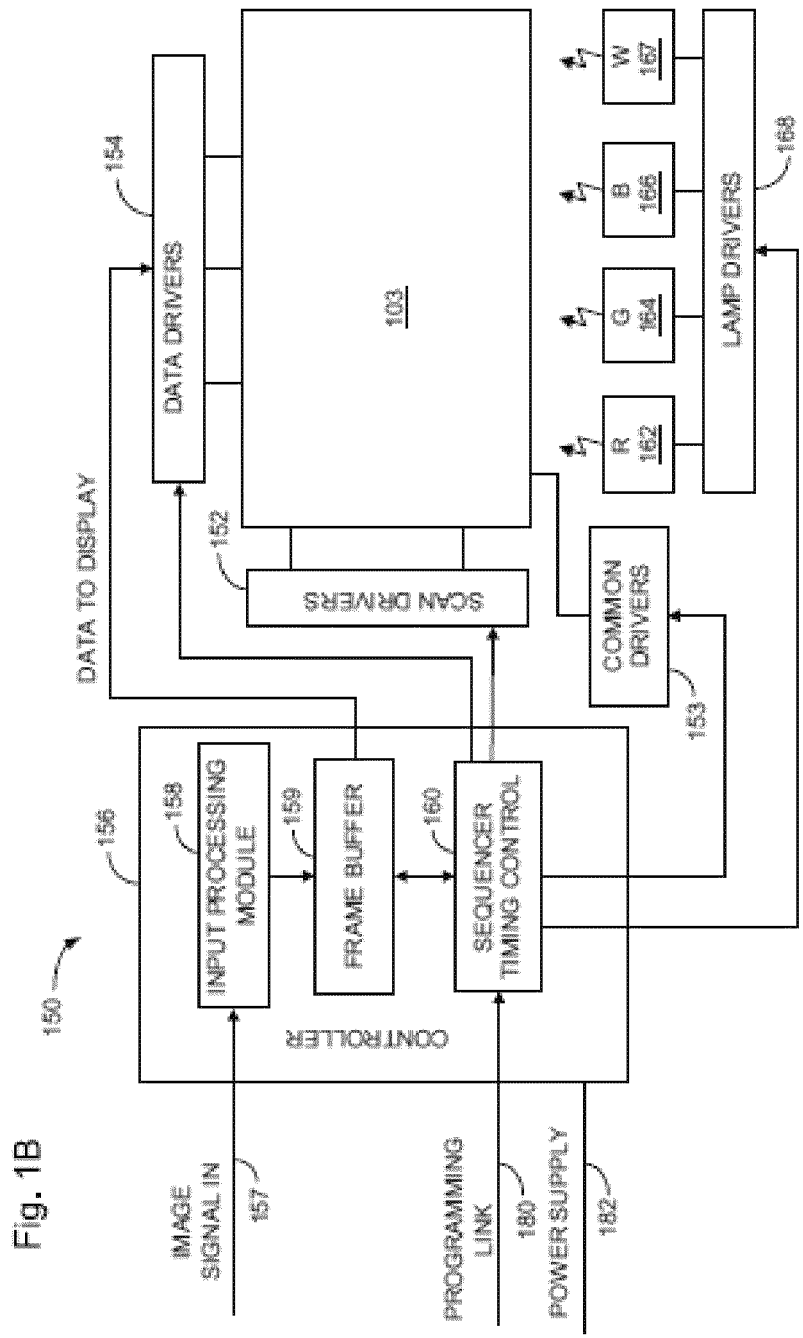
FIG. 1B is a block diagram of the display apparatus of FIG. 1A.

FIG. 1B is a block diagram 150 of the display apparatus 100 of FIG. 1A. Referring to FIGS. 1A and 1B, in addition to the elements of the display apparatus 100 described above, as depicted in the block diagram 150, the display apparatus 100 includes a plurality of scan drivers 152 (also referred to as "write enabling voltage sources") and a plurality of data drivers 154 (also referred to as "data voltage sources"). The scan drivers 152 apply write enabling voltages to scan-line interconnects 110. The data drivers 154 apply data voltages to the data interconnects 112. In some implementations of the display apparatus, the data drivers 154 are configured to provide analog data voltages to the light modulators, especially where the gray scale of the image 104 is to be derived in analog fashion. In analog operation the light modulators 102 are designed such that when a range of intermediate voltages is applied through the data interconnects 112 there results a range of intermediate open states in the shutters 108 and therefore a range of intermediate illumination states or gray scales in the image 104.

In other cases the data drivers 154 are configured to apply only a reduced set of 2, 3, or 4 digital voltage levels to the control matrix. These voltage levels set, in digital fashion, either an open state or a closed state to each of the shutters 108.

The scan drivers 152 and the data drivers 154 are connected to digital controller circuit 156 (also referred to as the "controller 156"). The controller 156 includes an input processing module 158, which processes an incoming image signal 157 into a digital image format appropriate to the spatial addressing and the gray scale capabilities of the display 100. The pixel location and gray scale data of each image is stored in a frame buffer 159 so that the data can be fed out as needed to the data drivers 154. The data is sent to the data drivers 154 in mostly serial fashion, organized in predetermined sequences grouped by rows and by image frames. The data drivers 154 can include series to parallel data converters, level shifting, and for some applications digital to analog voltage converters.

The display apparatus 100 optionally includes a set of common drivers 153. In some implementations the common drivers 153, following commands from the controller 156, issue voltage pulses which are capable of driving and/or initiating simultaneous actuation of all light modulators in multiple rows and columns of the array of pixels 103.

The drivers (e.g., scan drivers 152, data drivers 154, and common drivers 153) for different display functions are time-synchronized by a timing-control module 160 in the controller 156. Timing commands from the module 160 coordinate the illumination of red, green and blue and white lamps (162, 164, 166, and 167 respectively) via lamp drivers 168, the write-enabling and sequencing of specific rows within the array of pixels 103, the output of voltages from the data drivers 154, and the output of voltages that provide for light modulator actuation.

The controller 156 determines the sequencing or addressing scheme by which each of the shutters 108 in the array 103 can be re-set to the illumination levels appropriate to a new image 104.

In some implementations, the data for an image state 104 is loaded by the controller 156 to the array of pixels 103 by a sequential addressing of individual rows, also referred to as scan lines. For each row or scan line in the sequence, the scan driver 152 applies a write-enable voltage to the write enable interconnect 110 for that row of the array 103, and subsequently the data driver 154 supplies data voltages, corresponding to desired shutter states, for each column in the selected row. This process repeats until data has been loaded for all rows in the array. In some implementations the sequence of selected rows for data loading is linear, proceeding from top to bottom in the array. In other implementations, the sequence of selected rows is pseudo-randomized, in order to minimize visual artifacts. In further implementations, the sequencing is organized by blocks, where, for a block, the data for only a certain fraction of the image state 104 is loaded to the array, for instance by addressing only every $5^{th}$ row of the array in sequence.

In alternative implementations, the array of pixels 103 and the control matrix that controls the pixels may be arranged in configurations other than rectangular rows and columns. For example, the pixels can be arranged in hexagonal arrays or curvilinear rows and columns. In general, as used herein, the term scan-line shall refer to any plurality of pixels that share a write-enabling interconnect.

The display 100 includes of a plurality of functional blocks including the timing control module 160, the frame buffer 159, scan drivers 152, data drivers 154, and drivers 153 and 168. Each block can be understood to represent either a distinguishable hardware circuit and/or a module of executable code. In some implementations the functional blocks are provided as distinct chips or circuits connected together by means of circuit boards and/or cables. Alternately, many of these circuits can be fabricated along with the pixel array 103 on the same substrate of glass or plastic. In other implementations, multiple circuits, drivers, processors, and/or control functions from block diagram 150 may be integrated together within a single silicon chip, which is then bonded directly to the transparent substrate holding pixel array 103.

The controller 156 includes a programming link 180 by which the addressing, color, and/or gray scale algorithms, which are implemented within controller 156, can be altered according to the needs of particular applications. In some implementations, the programming link 180 conveys information from environmental sensors, such as ambient light or temperature sensors, so that the controller 156 can adjust imaging modes or backlight power in correspondence with environmental conditions. The controller 156 also includes a power supply input 182 which provides the power needed for lamps as well as light modulator actuation. Where necessary, the drivers 152, 153, 154, and/or 168 may include or be associated with DC-DC converters for transforming an input voltage at 182 into various voltages sufficient for the actuation of shutters 108 or illumination of the lamps, such as lamps 162, 164, 166, and 167.

Figure 2:
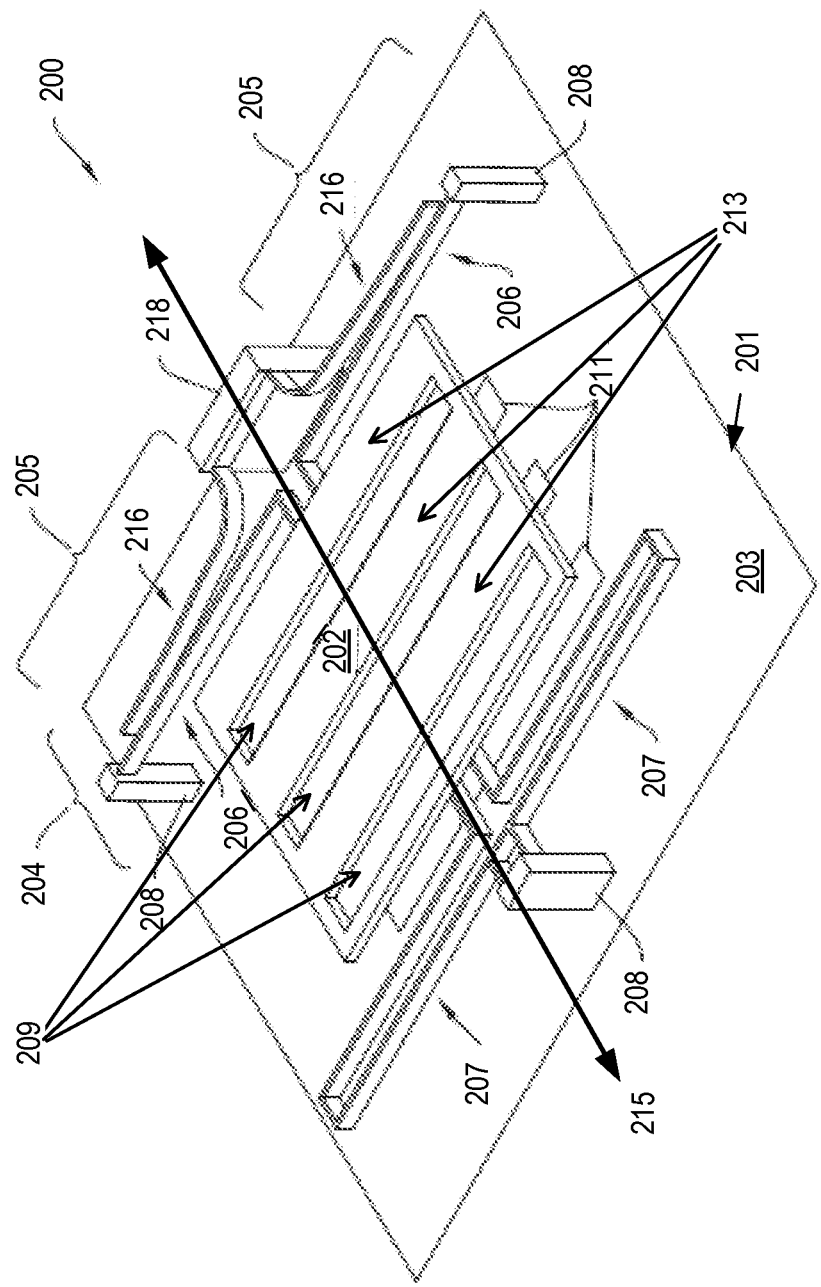
FIG. 2 is a perspective view of an illustrative shutter-based light modulator suitable for incorporation into the MEMS-based display of FIG. 1A.

FIG. 2 is a perspective view of an illustrative shutter-based light modulator 200 suitable for incorporation into the MEMS-based display apparatus 100 of FIG. 1A. The shutter-based light modulator 200 (also referred to as shutter assembly 200) includes a shutter 202 coupled to an actuator 204. The shutter 202 includes three slots 209 and three light blocking sections 213. The actuator 204 is formed from two separate compliant electrode beam actuators 205 (the "actuators 205"). The shutter 202 couples on one side to the actuators 205. The actuators 205 move the shutter 202 transversely over a surface 203 of substrate 201 in a plane of motion which is substantially parallel to the surface 203. The opposite side of the shutter 202 couples to a spring 207 which provides a restoring force opposing the forces exerted by the actuator 204.

Each actuator 205 includes a compliant load beam 206 connecting the shutter 202 to a load anchor 208. The load anchors 208 along with the compliant load beams 206 serve as mechanical supports, keeping the shutter 202 suspended proximate to the surface 203 of substrate 201. The load anchors 208 physically connect the compliant load beams 206 and the shutter 202 to the surface 203 and electrically connect the load beams 206 to a bias voltage, in some instances, ground.

Each actuator 205 also includes a compliant drive beam 216 positioned adjacent to each load beam 206. The drive beams 216 couple at one end to a drive beam anchor 218 shared between the drive beams 216. The other end of each drive beam 216 is free to move. Each drive beam 216 is curved such that it is closest to the load beam 206 near the free end of the drive beam 216 and the anchored end of the load beam 206.

The surface 203 includes one or more apertures 211 for admitting the passage of light. If the shutter assembly 200 is formed on an opaque substrate 201, made for example from silicon, then the surface 203 is a surface of the substrate 201, and the apertures 211 are formed by etching an array of holes through the substrate 201. If the shutter assembly 200 is formed on a transparent substrate 201, made for example of glass or plastic, then the surface 203 is a surface of a light blocking layer deposited on the substrate 201, and the apertures are formed by etching the surface 203 into an array of holes 211. The apertures 211 can be generally circular, elliptical, polygonal, serpentine, or irregular in shape. The depicted shutter 202 has three slots 213 that can be aligned with the apertures 211 of substrate 201. The alignment between the apertures 211 and the slots 213 controls, in part, the amount of light that can pass through the substrate 201 and pass through the shutter 202. The depicted slots 213 are rectangular, but any suitable shape or pattern may be employed.

In operation, a display apparatus incorporating the light modulator 200 applies an electric potential to the drive beams 216 via the drive beam anchor 218. A second electric potential may be applied to the load beams 206. The resulting potential difference between the drive beams 216 and the load beams 206 pulls the free ends of the drive beams 216 towards the anchored ends of the load beams 206, and pulls the shutter ends of the load beams 206 toward the anchored ends of the drive beams 216, thereby driving the shutter 202 transversely towards the drive anchor 218. The compliant members 206 act as springs, such that when the voltage across the beams 206 and 216 is removed, the load beams 206 push the shutter 202 back into its initial position, releasing the stress stored in the load beams 206. The drive beams 216 and compliant members 206 move the shutter 202 transversely over the apertures 211. The shutter 202 travels back and forth along a linear path indicated by the line 215.

The actuator 205 within the elastic shutter assembly is said to operate between a first position and a second position, which for this depicted example is a closed or actuated position and a relaxed position. The designer, however, can choose to place apertures 211 such that shutter assembly 200 is in either the "open" state, i.e. passing light, or in the "closed" state, i.e. blocking light, whenever actuator 205 is in its relaxed position. For illustrative purposes, it is assumed below that elastic shutter assemblies described herein are designed to be open in their relaxed state. The shutter 202 moves between the open position, in which the slots 209 are aligned over the apertures 211 to allow light to travel from the apertures 211 and through the slots 209, and the closed position, in which the light blocking sections 213 are aligned over the apertures 211 to block light from traveling past the shutter 202.

In some implementations, a set of "open" and "closed" actuators may be provided as part of a shutter assembly so that the control electronics are capable of electrostatically driving the shutters into each of the open and closed states.

Other types of shutter control systems may be employed with the display described herein. In some cases, control is accomplished by means of a passive matrix array of row and column interconnects connected to driver circuits on the periphery of the display. In other cases it is appropriate to include switching and/or data storage elements within each pixel of the array (the so-called active matrix) to improve either the speed, the gray scale and/or the power dissipation performance of the display. Any of these control systems may be employed with the systems and methods described herein.

Figure 3A:
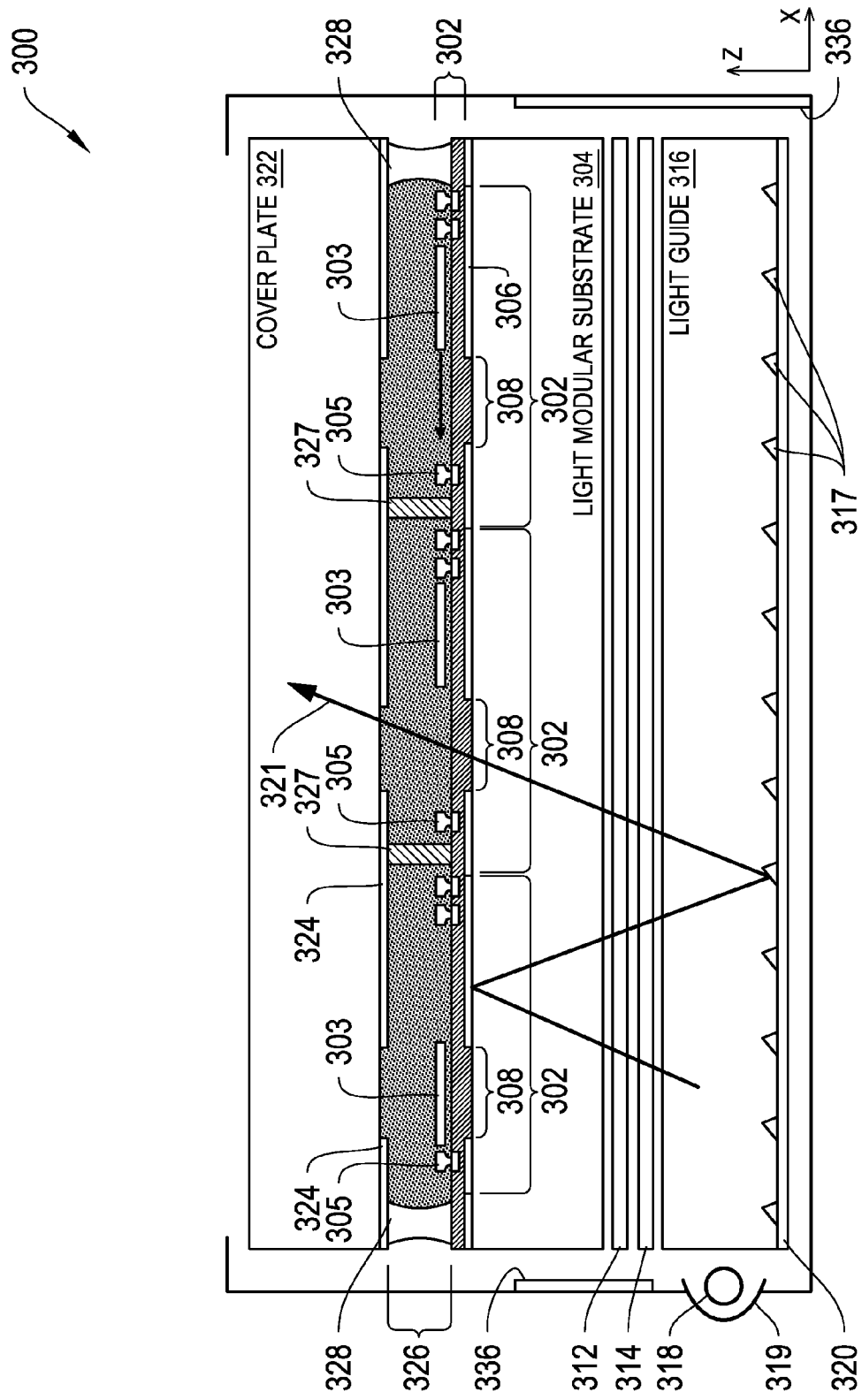
FIG. 3A is a cross-sectional view of a shutter-based display apparatus.

FIG. 3A is a cross sectional view of a display apparatus 300 incorporating shutter-based light modulators (shutter assemblies) 302. Each shutter assembly 302 incorporates a shutter 303 and an anchor 305. Not shown are the compliant beam actuators which, when connected between the anchors 305 and the shutters 303, help to suspend the shutters a short distance above the surface. The shutter assemblies 302 are disposed on a transparent substrate 304, that may be made of plastic or glass. A rear-facing reflective layer, reflective film 306, disposed on the substrate 304 defines a plurality of surface apertures 308 located beneath the closed positions of the shutters 303 of the shutter assemblies 302. The reflective film 306 reflects light not passing through the surface apertures 308 back towards the rear of the display apparatus 300. The reflective aperture layer 306 can be a fine-grained metal film without inclusions formed in thin film fashion by a number of deposition techniques including sputtering, evaporation, ion plating, laser ablation, or chemical vapor deposition. In another implementation, the rear-facing reflective layer 306 can be formed from a mirror, such as a dielectric mirror. A dielectric mirror is fabricated as a stack of dielectric thin films which alternate between materials of high and low refractive index. The vertical gap which separates the shutters 303 from the reflective film 306, within which the shutter is free to move, is in the range of 0.5 to 10 microns. The magnitude of the vertical gap may be less than the lateral overlap between the edge of shutters 303 and the edge of apertures 308 in the closed state The display apparatus 300 includes an optional diffuser 312 and/or an optional brightness enhancing film 314 which separate the substrate 304 from a planar light guide 316. The light guide includes a transparent, i.e., glass or plastic, material. The depicted light guide 316 is illuminated by one or more light sources 318, forming a backlight. The light sources 318 can be, for example, and without limitation, incandescent lamps, fluorescent lamps, lasers, or light emitting diodes (LEDs). A reflector 319 helps direct light from lamp 318 towards the light guide 316. A front-facing reflective film 320 is disposed behind the backlight 316, reflecting light towards the shutter assemblies 302. Light rays such as ray 321 from the backlight that do not pass through one of the shutter assemblies 302 will be returned to the backlight and reflected again from the film 320. In this fashion light that fails to leave the display to form an image on the first pass can be recycled and made available for transmission through other open apertures in the array of shutter assemblies 302. Such light recycling has been shown to increase the illumination efficiency of the display.

The light guide 316 includes a set of geometric light redirectors or prisms 317 which re-direct light from the lamps 318 towards the apertures 308 and hence toward the front of the display. The light re-directors 317 can be molded into the plastic body of light guide 316 with shapes that can be alternately triangular, trapezoidal, or curved in cross section. The density of the prisms 317 generally increases with distance from the lamp 318.

In alternate implementations, the aperture layer 306 can be made of a light absorbing material, and in alternate implementations the surfaces of shutter 303 can be coated with either a light absorbing or a light reflecting material. In alternate implementations the aperture layer 306 can be deposited directly on the surface of the light guide 316. In alternate implementations the aperture layer 306 need not be disposed on the same substrate as the shutters 303 and anchors 305.

A cover plate 322 forms the front of the display apparatus 300. The rear side of the cover plate 322 can be covered with a black matrix 324 to increase contrast. In alternate implementations the cover plate 322 includes color filters, for instance distinct red, green, and blue filters corresponding to different ones of the shutter assemblies 302. The cover plate 322 is supported a predetermined distance away from the shutter assemblies 302 forming the depicted gap 326. The gap 326 is maintained by mechanical supports or spacers 327 and/or by an adhesive seal 328 attaching the cover plate 322 to the substrate 304. The adhesive seal 328 seals in a working fluid 330. The working fluid 330 can also serve as a lubricant. In one implementation, the working fluid 330 is a hydrophobic liquid with a high surface wetting capability.

A sheet metal or molded plastic assembly bracket 332 holds the cover plate 322, the substrate 304, the backlight 316 and the other component parts together around the edges. The assembly bracket 332 is fastened with screws or indent tabs to add rigidity to the combined display apparatus 300. In some implementations, the light source 318 is molded in place by an epoxy potting compound. Reflectors 336 help return light escaping from the edges of light guide 316 back into the light guide. Not shown in FIG. 3A are electrical interconnects which provide control signals as well as power to the shutter assemblies 302 and the lamps 318.

Figure 3B:
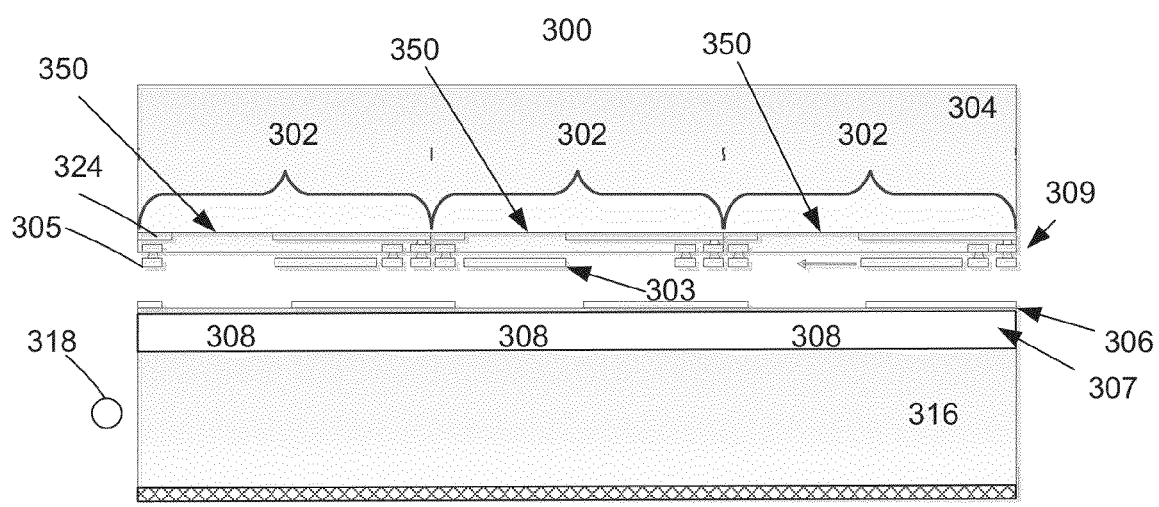
FIG. 3B is a cross-sectional view of a MEMS-down implementation of a shutter-based display apparatus.

Display apparatus 300 of FIG. 3A is referred to as the MEMS-up configuration, where the MEMS based light modulators are formed on a front surface of substrate 304, i.e. the surface that faces toward the viewer. The shutter assemblies 302 are built directly on top of the reflective aperture layer 306. In an alternate implementation, referred to as the MEMS-down configuration, the shutter assemblies are disposed on a substrate separate from the substrate on which the reflective aperture layer is formed. FIG. 3B is a cross-sectional view of a MEMS-down implementation of a shutter-based display apparatus. In the MEMS-down configuration of FIG. 3B, the substrate 304 that carries the MEMS-based light modulators 302 takes the place of the cover plate 322 in display apparatus 300 of FIG. 3A and is oriented such that the MEMS-based light modulators 302 are positioned on the rear surface of the top substrate, i.e. the surface that faces away from the viewer and toward the back light 316. In the MEMS-down implementation, the MEMS-based light modulators 302 are positioned directly opposite to and across a gap from the reflective aperture layer 306. The gap can be maintained by a series of spacer posts (not shown) connecting the aperture plate 307 and the substrate 304 on which the MEMS modulators 302 are formed. In some implementations, the spacers are disposed within or between each pixel in the array. The gap or distance that separates the MEMS light modulators 302 from their corresponding apertures 308 may be less than 10 microns, or a distance that is less than the overlap between shutters and apertures. The shutter assemblies 302 formed on substrate 304 are aligned with respective apertures 308 formed, in this implementation, within a reflecting film that forms the aperture layer 306 on the aperture plate 307. Light from the light cavity 316 may pass through the apertures 308 within the aperture layer 306, and pass toward the apertures 350 formed within a layer 324. In one implementation, the layer 324 is a layer of metal material deposited on the surface of a transparent substrate 304 that in one implementation is formed of glass, plastic or some other suitable material. The shutter 303 of a shutter assembly 302 may move to a position between the apertures 308 and 350 to block light from passing through the aperture 308 and into the aperture 350. Alternatively, the shutter 303 may be positioned laterally away from the apertures 308 and 350, to allow light to pass from the aperture 308 and through the aperture 350.

FIG. 4 depicts an overhead view of MEMS-based shutter in a first position and a MEMS-based shutter in a second position. In particular, FIG. 4 depicts an overhead view of a portion of a shutter array 400 that includes a first shutter assembly 402A and a second shutter assembly 402B. Each shutter assembly 402A and 402B includes a shutter 404 that moves along an direction of motion 410 between a first position and a second position, moving transversally across a respective aperture 408. The shutter assemblies 402A and 402B are formed on a substrate 430. The substrate 430 may be transparent and may be glass, plastic or any other suitable material. It will be understood by those of skill in the art that although two shutter assemblies 402A and 402B are depicted in FIG. 4, in a typical display, many hundreds, thousands or millions of shutter assemblies, like the depicted shutter assemblies 402A and 402B, may be formed on the substrate 430.

The depicted apertures 408 are formed within the substrate 430 and as noted with reference to FIGS. 3A and 3B, the apertures 408 allow light to pass from a light guide, such as the light guide 316, toward the shutters 404A and 404B. In the implementation of FIG. 4, the apertures 408A and 408B are formed by etching apertures in a layer of light blocking film 419 that is deposited on a surface of the substrate 430. The depicted apertures 408 have a rectangular peripheral edge with a first side 432 and a second side 434 that are aligned transverse to the line 410 indicating the direction of motion. The shutters 404A and 404B are also rectangular and have peripheral edges that include a first edge 436 and second edge 438, both edges 436 and 438 also being transverse to the direction of motion 410. Each shutter 404A and 404B has a length extending along axis 450 and a width extending along axis 452.

The shutter 404A is depicted as aligned over the aperture 408A, and aperture 408A is illustrated with a dashed line peripheral edge and crosshatched interior to indicate that shutter 404A covers aperture 408A. As aligned, the shutter 404A blocks passage of light through the aperture 408A, modulating light through the aperture 408A to reduce the brightness of light transmitted from shutter assembly 402A.

FIG. 4 depicts that the shutters 404A and 404B move between two positions. The shutter 404A of assembly 402A is illustrated in the first position, which in this implementation, blocks the transmission of light from the aperture 408. The shutter 404B of shutter assembly 402B is illustrated in the second position, which in this implementation, is laterally spaced away from the aperture 408B to allow light to pass through the aperture 408B. The depicted first and second shutter positions are merely examples of positions for the shutters 404, and in other implementations, the shutters may move partway across the aperture to a position that partially overlaps with the aperture. Moreover, in implementations having shutters with slots of the type depicted by slots 209 in FIG. 2, the first and second positions may correspond to positions that arrange the slots 209 into different alignments relative to the apertures 211 in substrate 230. Still other implementations may use multiple shutters to cover an aperture and block the passage of light through the aperture and in these implementations, the positions of the multiple shutters may also vary from the positions depicted in FIG. 4.

FIG. 4 further depicts that the shutters 404A and 404B each cover a larger surface area than their respective apertures 408A and 408B. As such, the peripheral edge of the shutter, such as shutter 404A, extends past the peripheral edge of the aperture 408A and overlaps with the light blocking film 419 that is deposited on the surface of the substrate 430. In the depicted example, the shutter 404A has both a larger length and width than the length and width of the aperture 408A. However, in other implementations, the shutter 404A may have a length, as measured along axis 450 that is equal to or substantially equal to the length, as measured along axis 450, of the aperture 408A.

FIG. 4 further illustrates that the shutter 404A is asymmetrically aligned with aperture 408A to have the first shutter edge 436A extend a distance 415A past the first side 432A of the aperture 408A and the second shutter edge 438A extend a second longer distance 414A past the second side 434A of the aperture 408A. The shutter 404A when arranged in the first position is asymmetrically aligned with the aperture 408A and at least, or more than, coextensive with the aperture 408A. The larger surface area of shutter 404A results in the rectangular peripheral edge of the shutter 404A extending past the peripheral edge of the aperture 408A and overlapping with the light blocking film 419 on the substrate 430. Dashed lines illustrate the distance 414A that the second shutter edge 438A extends beyond the side 434A of the aperture 408A. Similarly, dashed lines also indicate the distance 415A that the first shutter edge 436A extends beyond the side 432A of the aperture 408A. As illustrated, the distance 414A is larger than the distance 415A. Thus, the second shutter edge 438A extends a greater distance past the second aperture side 434A and provides a greater overlap with the light blocking film 419 for blocking light passing from the aperture 408A.

In the example depicted in FIG. 4, the typical shutter 408A has a length of about 1-50 microns and a width of 5-200 microns. The distances 414A and 415A will typically range from 1 micron to 20 microns and more commonly between 2 microns and 10 microns, although other distances may be used, and the size of the shutters and apertures may vary as well, with the size selected based on the application being addressed.

FIG. 4 depicts the shutter 404B laterally spaced away from the aperture 408B, having moved transversely along the line 410, which represents the direction of motion of the shutter 404B across the aperture 408B. The movement of shutter 404B from the closed position of the shutter, depicted by shutter 404A, to this second open position, causes the first edge 436B of the shutter 404B to move transversely across the aperture 408B. The shutter 404B moves until all or substantially all of the aperture 408B is exposed and uncovered to allow light to pass through the aperture 408B and travel past the shutter 404B in a direction out of the page. The depicted shutter 404B moves to a position that is laterally spaced away from the aperture 408B so that the shutter edge 436B is laterally spaced from the second edge 434B of the aperture 408B. In alternate implementations, the shutter 404B may, when moved to the second position, have its first edge 436B substantially aligned over the second edge 434B of the aperture 408B, or may alternatively maintain the first edge 436B at a location that has the shutter 404B still cover some portion of the aperture 408B. One implementation of how a shutter may align relative to the edge of an aperture will be described more fully below with reference to FIG. 5B.

Figure 5A:
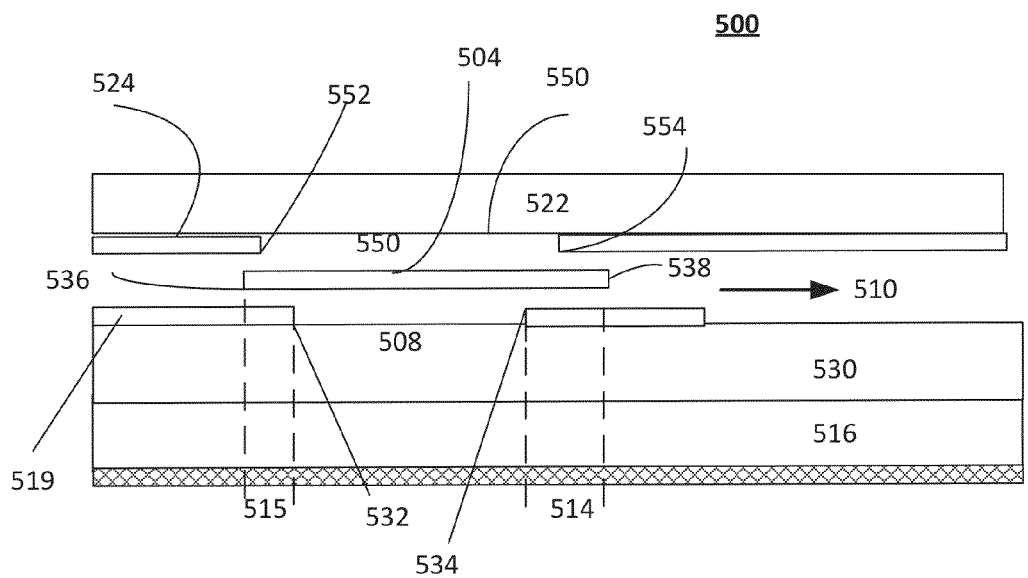
FIGS. 5A and 5B depict a cross-sectional view illustrating a shutter asymmetrically aligned between a first and second aperture and moving transversely along a direction of motion of axis.
Figure 5B:
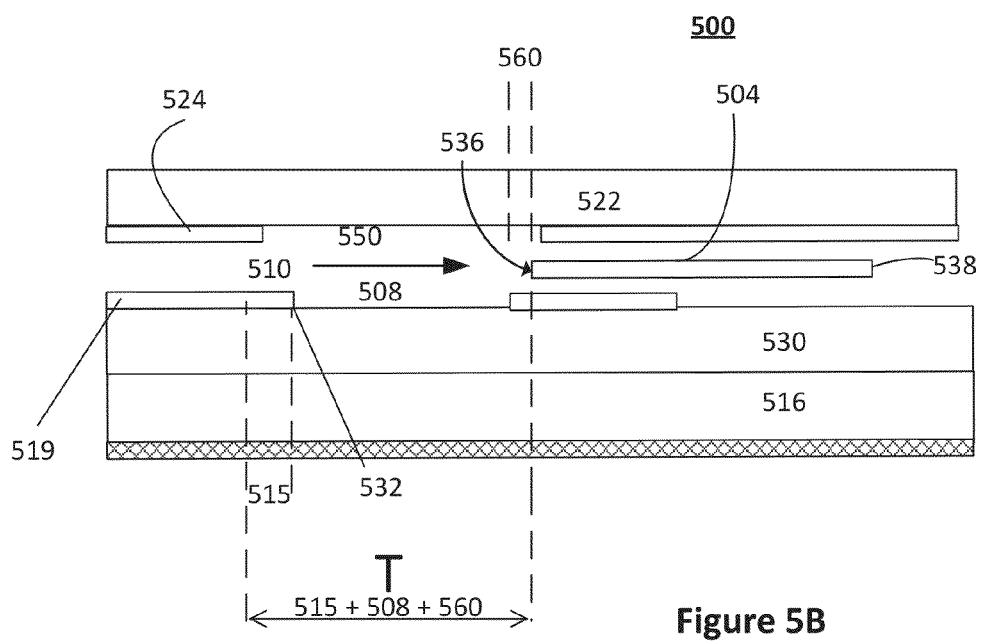

FIGS. 5A and 5B depict a cross-sectional view illustrating a shutter asymmetrically aligned between a first and second aperture and moving transversely along a direction of motion. FIG. 5A presents a cross-sectional view of a shutter asymmetrically aligned between a first and second aperture. In particular, FIG. 5A depicts a shutter assembly 500 that includes a shutter 504 arranged between a first aperture 508 and a second aperture 550. The aperture 508 is formed within a film 519 of light blocking material that is deposited on the substrate 530. The shutter 504 has a first edge 536 that extends beyond the first aperture 508 and overlaps the light blocking film 519 by a length 515 and a second edge 538 that extends beyond the aperture 508 and overlaps the light blocking film 519 by a second larger length 514. Shutter 504 moves transversely across the aperture 508 along a direction of motion indicated by line 510. An actuator, not shown but may be similar to the actuators 305 of FIG. 3, may drive the shutter 504 along the direction of motion between a first and a second position. The shutter 504 is shown in a closed position with the shutter 504 aligned co-extensively with, that is fully covering, the first aperture 508 in the substrate 530. As positioned, the shutter 504 blocks light from the light guide 516 from passing through aperture 508 and through aperture 550.

The aperture 550 may be formed in a film 524 of material such as a black matrix material similar to the material of the mask 324 of FIG. 3. The film 524 may be lithographically patterned or otherwise processed to form apertures 550. The apertures 550 are aligned with the aperture 508 on substrate 530. Typically, although not always, the shape of the aperture 550 is similar to the shape of the aperture 508. Although illustrated in cross-section, the aperture 550 is formed as a rectangular opening within the film 524 and has a rectangular peripheral edge with a first edge 552 and a second edge 554. The first edge 552 overlaps the edge 536 of the shutter 504 when in the closed position. Similarly, the second edge 554 overlaps and extends past the second edge 538 of shutter 504. As such both edges 536 and 538 of shutter 504 overlap with the film 524 when the shutter 504 is in the closed position. In the depicted implementation, the aperture 550 is larger than the aperture 508. Both peripheral edges 532 and 534 of aperture 508 are laterally spaced from the edges 552 and 554 of the aperture 550, so that the aperture 508 is fully exposed by and uncovered by the aperture 550 when the shutter 504 is in the open position.

FIG. 5B depicts pictorially a cross-sectional view of the shutter 504 having moved transversely in the direction indicated by line 510. The shutter 504 has moved to a position that is laterally spaced away from the aperture 508 to allow light from light guide 516 to pass through aperture 508 and through aperture 550. In the depicted implementation the shutter 504 is laterally spaced away from the aperture 508 by a distance 560 that represents a tolerance gap. The tolerance gap represents spacing to accommodate variation in manufacturing that can cause the actual position of a shutter to vary from its expected position. The depicted tolerance gap distance 560 accommodates these variations so that the shutter 508 will, even with these variations, be spaced away from the aperture 508 when open. Movement of the shutter 504 can be driven by an actuator (not shown) and will move the shutter 504 between the first position and the second position.

As can be seen from comparing FIGS. 5A and 5B, it is the edge 536 of the shutter 504 that travels across the aperture 508. The edge 536 is the leading edge of the shutter 504 and it is the edge 536 of the shutter 504 that travels fully across the aperture 508 to place the shutter 504 in an open or closed state. The second and trailing edge 538 of the shutter 504 does not cross the aperture 508. The second edge 538 moves toward and away from the aperture 508, but gets no closer than at least the distance 514 from the aperture 508. As such, as shown in FIG. 5B the overall distance of travel (T) of the shutter 508 will be the distance traveled by the leading edge 536, which in one implementation may be:

T=overlap 515+width of aperture 508+any tolerance gap 560

The distance T determines, at least in part, the time needed to move the shutter 504 between the open and closed positions. In one implementation, the overlap 515 may range from 1 um to 5 um and tolerance T can range from 0 um to 3 um. However, the length of the overlap and the tolerance may vary depending upon the application. The distance T is independent of the distance 514, which is the distance that edge 538 of the shutter 504 overlaps the light blocking film 519 when the shutter 504 is closed. As such, the distance 514 may be increased without altering the distance T, or the time needed to move the shutter 504 between the open and closed position. However, extending the distance 514 may improve the ability of the shutter 504, when in the closed position, to block light, particularly light that passes between the edge 538 of the shutter 504 and the light blocking film 519. FIG. 6A is a cross-sectional view of light from a light source passing through a gap between an aperture and a shutter.

In particular, FIG. 6A depicts a portion of a display 600 that includes a plurality of shutter assemblies 602A, 602B and 602C having shutters 604A, 604B and 604C disposed proximate respective apertures 608A, 608B and 608C formed on a substrate 630 mounted to a light guide 616. A cover plate 622 is positioned adjacent to film 632 in which the apertures 650A, 650B and 650C are formed. FIG. 6A further depicts a light source 618 that transmits light into the light guide 616. Light guide 616 disperses the light within the light guide 616 and directs light toward the substrate 630 and apertures 608A, 608B and 608C.

FIG. 6A depicts that the shutter 604A is asymmetrically aligned with the aperture 608A when in closed position to reduce light leakage and in particular, to reduce light escaping through the gap 626. In FIG. 6A, the shutter 604A is disposed over the aperture 608A and obstructs light from passing through the aperture 650A, i.e. the shutter 604A is in the closed position. However, FIG. 6A depicts that shutter 604A is vertically spaced away from the substrate 630 and the aperture 608A. The space between the shutter 604A and the light blocking film 619 on the substrate 630 forms the gap 626 indicated by dashed lines. The gap 626 is illustrated on both sides of the shutter 604A and it will be apparent to those of skill in the art that the gap 626 extends typically around the full periphery of shutter 604A. The gap 626 provides an opening through which light traveling along a limited range of angles may pass under the shutter 604A and pass through cover plate 622 even when shutter 604A is in the closed position. This escaping light, or light leakage, may reduce the contrast ratio, at least at certain viewing angles, for the display.

FIG. 6A depicts light 621 escaping from the gap 626 on the right side of the closed shutter 604A. Specifically, FIG. 6A depicts one type of light leakage which is light that travels, either directly, or as depicted, by reflecting against surfaces, through the gap 626 and out an aperture of an adjacent shutter assembly. The leak is depicted by the light ray 621 escaping from under one shutter 604A and then passing out through a second adjacent aperture 650B. The end portion of light ray 621 is depicted as a dashed line to represent the diminished intensity of light reflected from the surface 619. Extending the edge 638 further from the aperture 608A, allows the shutter 604A to block light that would have passed through the gap 626, or to cause light to reflect more times off surface 619 and progressively diminish in intensity.

FIG. 6B is a pictorial representation of a pattern of diffracting light passing around an edge of a shutter. FIG. 6B depicts the diffracting light as leakage light that can propagate through the gap 626 between the shutter 604A and the light blocking film 619. FIG. 6B pictorially depicts the diffracting light as a series of arcs 623. One portion of the diffracting pattern, shown by arcs 625, propagates through the aperture 650A. The gradually increasing spacing of the arc lines 623 and 625 represent the diminishing intensity of the diffracted light. By moving the edge 638 of the shutter 604A laterally further from the aperture 650A, the intensity of the diffracted light passing through the aperture 650 will be less than if the edge 638 were closer to the aperture 650A. Thus, extending the edge 638 to a position further from the aperture 650A reduces the intensity of diffracted light passing through the aperture 650A when the shutter 604A is in the closed position and improves contrast ratios for images generated by the shutter 604A.

Thus, light leakage from either source may reduce the contrast ratio between an open shutter and a closed shutter. The ability for the shutter to prevent light leakage is in part determined by the distance the shutter, such as shutter 604A, extends across the light blocking films 619 and 632 that define the apertures, such as apertures 608A and 650A.

In the systems and methods described herein, the shutter 604A is asymmetrically aligned over the aperture 608A, as shown in FIG. 6A, so that the distance 614 illustrated on the right side of the aperture 608A is larger than the distance 615 on the left side of the aperture 608A. The larger distance 614 that the shutter 604A overlaps the film 619, will reduce the diffractive leakage through aperture 650A, and reflective leakage through 650B, and therefore improve contrast ratio.

As noted above with reference to FIG. 5B, the distance the shutter 504 travels to move into the open or closed position is equal to the distance 515 plus the aperture 508 width plus any tolerance 560. It can be seen that travel distance T is a function of the distance that the edge 536 of the shutter 504 travels, as this is the edge of the shutter 504 that travels across the aperture 508. Thus the travel distance is a function of the distance 515, but not of the distance 514. By increasing the distance 514 that the shutter 508 overlaps the light blocking film 519 when closed, but not the distance 515, the systems and methods described herein increase the shutter's ability to prevent light leakage from beneath the edge 538 of the shutter 504, without increasing the travel distance or travel time needed to switch states between open and closed positions.

Figure 7:
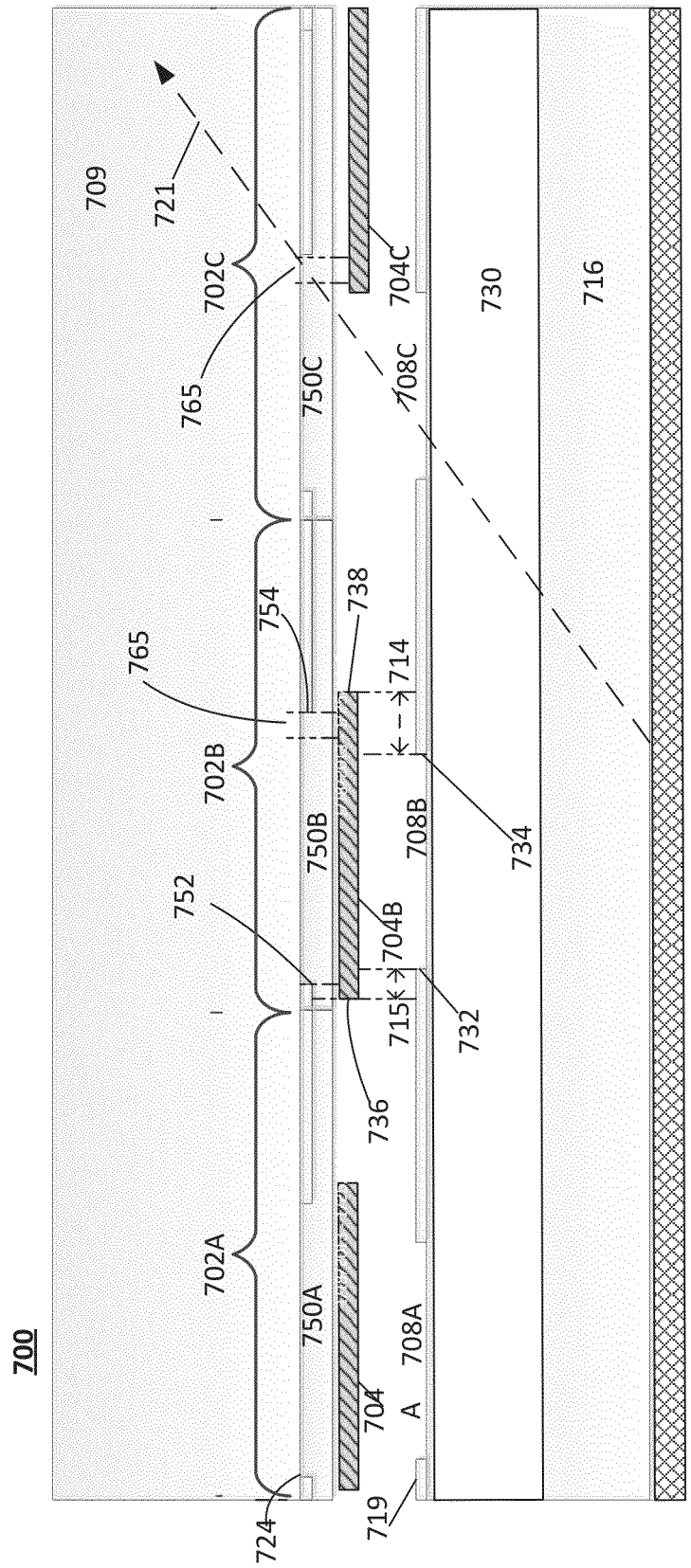
FIG. 7 is a cross-sectional view of a MEMS-based shutter asymmetrically aligned over a first aperture and wherein a second aperture has an increased width.

Furthermore, as depicted in FIG. 5A, if the distance 514 is large enough, the aperture 550 can be widened on the side of the aperture 550 that is proximate the edge 538 of the shutter 504. FIG. 7 is a cross-sectional view of a MEMS-based shutter asymmetrically aligned over a first aperture and wherein a second aperture has an increased width. FIG. 7 illustrates a MEMS-down shutter display 700 that has shutter assemblies 702A, 702B and 702C formed on the surface of a MEMS substrate 709 that faces toward a light cavity 716. The shutter assemblies have respective shutters 704A, 704B and 704C that are asymmetrically aligned over respective apertures 708A, 708B and 708C. Shutter assemblies 702A, 702B and 702C are similar, so for ease of depiction and understanding, the structure of these shutter assemblies will be described with reference to shutter assembly 702B.

Shutter assembly 702B includes the shutter 704B has an overlap 714 on one side of the shutter 704B that is larger than the overlap 715 on the other side shutter 704B. Thus, the shutter 704B, like shutter 604A of FIG. 6A, is extended on its right side, so that the edge 738 of the shutter 704B is a further distance from the aperture 708B than the edge 736 is from the aperture 708B. The shutter assembly 702B also has an upper aperture 750B that is extended, as compared to the aperture 650B of FIG. 6A, a distance 765 on the side of the aperture 750B proximate to the edge 738 of the shutter 704B. Thus, both the shutter 704B and the aperture 750B are extended further to the right of the aperture 708B. The aperture 750B is similar to the aperture 650B described earlier, and may be defined by a layer of light blocking film 724. Typically, the layer 724 will be a layer of metal material formed on the MEMS substrate 709, on which the shutter assemblies 702A, 702B and 702C are formed. The aperture 750 in the film 724 is asymmetrically aligned over the aperture 708 in the substrate 730 to extend further on the right side. The wider aperture 750 provides the additional distance 765 for transmitting light that is at a high off-axis angle, such as light ray 721. Light ray 721 is traveling at an angle and along a path that passes through the extended aperture space 765. This improves the viewing angle of the shutter assembly 702 on the side of the assembly 702 having the additional distance 765 added to the aperture 750. Additionally, the extended aperture 750 can improve display brightness.

Figure 8:
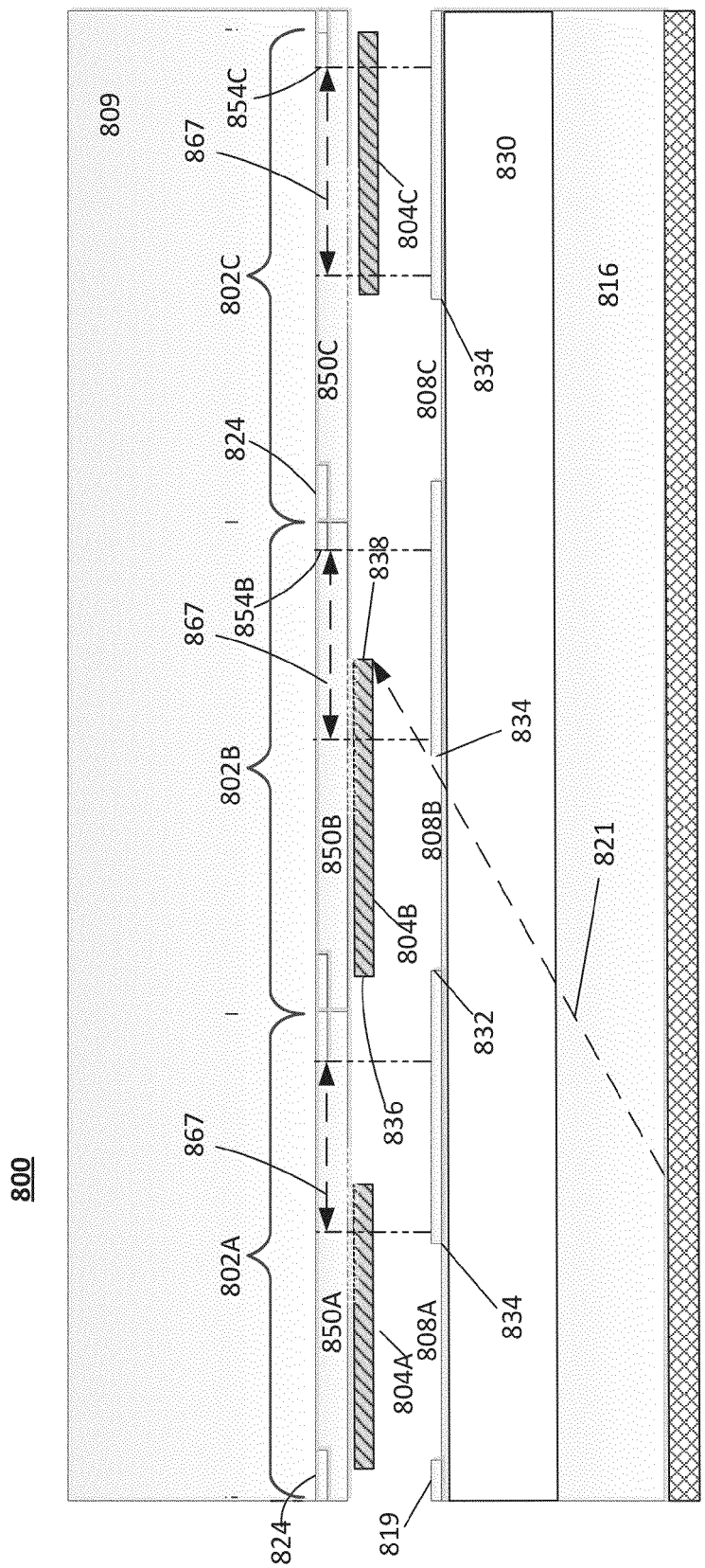
FIG. 8 is a cross-sectional view of a MEMS-based shutter asymmetrically aligned over a first aperture and wherein a second aperture extends to a terminal edge of a shutter assembly formed on a substrate.

FIG. 8 is a cross-sectional view of a MEMS-based shutter asymmetrically aligned over a first aperture and wherein a second aperture extends to a terminal edge of a shutter assembly formed on a substrate. FIG. 8 depicts three shutter assemblies 802A, 802B and 802C formed on a substrate 809 in a MEMS-down configuration that has the shutter assemblies 802A, 802B and 802C formed on the side of the substrate 809 that faces the aperture plate 830 and the light cavity 816. Each shutter assembly 802A, 802B and 802C has a shutter 804A, 804B and 804C that, in the closed position, is asymmetrically aligned with a respective aperture 808A, 808B and 808C, to extend further toward the side of the shutter assembly to which the shutter moves when opening. In this implementation, the shutter assemblies 802A, 802B and 802C have apertures 850A, 850B and 850C that are extended by a length 867 as compared to the apertures 650A, 650B and 650C in FIG. 6A. The aperture 850C has an end 854C that is at or near the terminal edge of the shutter assembly 802C. In FIG. 8, the aperture 850C is extended on the right side, which is the side that the shutter 804C moves to when open.

The shutters 804A, 804B and 804C also extend further on the right side, the side the shutters move to when opening. The extended shutters 804A, 804B and 804C are asymmetrically aligned over the respective apertures 808A, 808B and 808C. The extended shutters 804A, 804B and 804C provide a surface for blocking light rays, such as light rays 821, traveling at a high angle. Thus, the extended shutters 804A, 804B and 804C block light traveling at high angles and in a direction toward the edge 834 of the aperture 808A, 808B and 808C and reduce the need for the apertures 850A, 850B and 850C to include film 824 on the right side of the shutter assembly. The reduced or removed film 824, in turn, provides a larger aperture and therefore greater viewing angle toward the side to which the shutters move to open and provides higher off-axis brightness.

The additional length 867 can, in one practice, be achieved by removing, or not depositing, the film 824 on the substrate 809 at the location indicated by the double-headed arrow denoting the length 867. FIG. 8 depicts all three shutter assemblies 802A, 802B and 802C with an aperture extended on one side to the terminal edge, or substantially the terminal edge, of the shutter assembly, but in some implementations, some of the shutter assemblies can have apertures that are not extended to the terminal edge of its respective shutter assembly. The shutter assemblies 802A, 802B and 802C are each oriented to have the shutters move to the right to the open position. In other implementations, the orientations of the shutter assemblies can vary, and some shutters in a display may move in a direction different from the other shutters in the same display.

The length of the extension 867 depends in part on the location of the interconnects, capacitors or other components that are built into the shutter assemblies. Typically, there are interconnects, transistors and optionally other features or components at the edge of the shutter assembly. In the device and process described with reference to FIG. 8, a section of that film 824 is removed up to the point where the transistors, interconnects and other components are located. Extending the apertures 850A, 850B and 850C to the location of these components, can increase the apertures and aperture ratio of the display 800, without interfering with the components that are in the respective shutter assemblies. In one implementation, the film 824 is a metal film capable of blocking light from the light cavity 816, and the extension 867 is a length of about 5 µm to 20 µm. An aperture with a film 824 that is removed to the nearest interconnect may be illustrated by an overhead plan view, such as the plan view depicted in FIG. 10. As shown, the aperture 1050 can be extended so that the shutter 1004 is exposed by the aperture 1050 when the shutter 1004 is in the open position and therefore spaced away from the aperture 1008. In row 1038, the apertures 1050 are extended substantially to the location of the interconnects 1064, or in other implementations to another component or feature, such as a transistor, or capacitor.

As noted above, the depicted shutters 804A, 804B and 804C each have a single body that blocks light. But in other implementations, the shutter may have multiple slots for passing light from multiple apertures, such as the shutter assembly 200 of FIG. 2.

Figure 9:
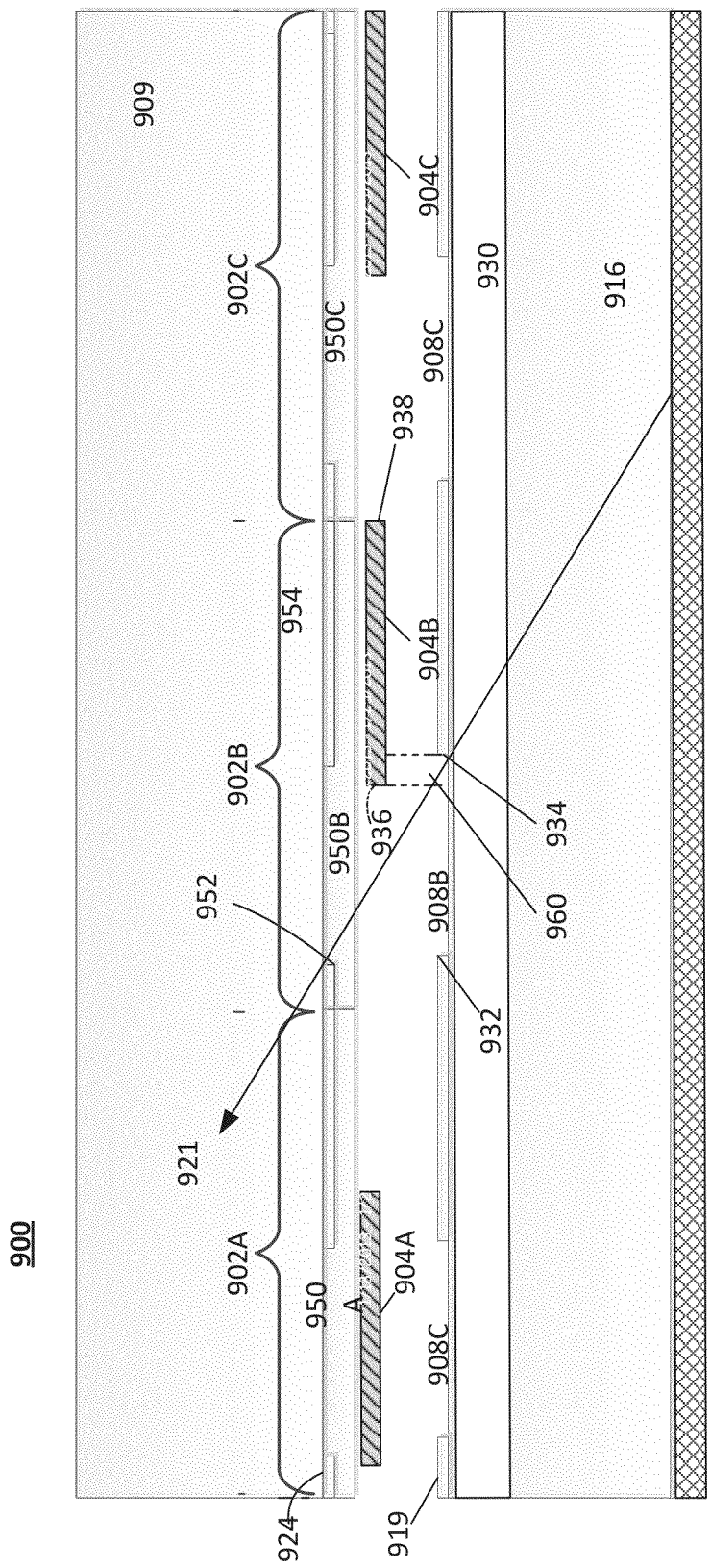
FIG. 9 is a cross-sectional view of a MEMS-based shutter asymmetrically aligned over a first aperture that extends under the shutter in a second position.

FIG. 9 is a cross-sectional view of a MEMS-based shutter asymmetrically aligned over a first aperture that extends under the shutter in a second position. FIG. 9 depicts three shutter assemblies 902A, 902B and 902C that formed on a substrate 909 in a MEMS-down configuration that has the shutter assemblies 902A, 902B and 902C formed on the side of the substrate 909 that faces the aperture plate 930 and the light cavity 916. Each shutter assembly 902A, 902B and 902C has a shutter 904A, 904B and 904C that, in the closed position, is asymmetrically aligned with a respective aperture 908A, 908B and 908C, to extend further toward the side of the shutter assembly to which the shutter moves when opening. In this implementation, FIG. 9 depicts a shutter 904B in the open position and laterally spaced away from edge 932 of the aperture 908B in substrate 930. In this implementation, to improve the viewing angle on the side 952 of the aperture 950B, the aperture 908B is widened. In one implementation the aperture 908B is widened to extend under the shutter 904B when the shutter 904B is in the open position. In this implementation the aperture 908B is widened such that a portion 960, depicted by dashed lines, of the shutter 904B extends over the aperture 908B so that the shutter 908B is suspended over the aperture 908B even when in the open position. The portion 960 can block light that impinges on that portion 960 and prevent that light from passing through the aperture 950B. However, the extended aperture 908B allows for the release of light along a high angle direction, depicted by light ray 921, and travelling away from that portion 960 and toward the end 952 of the aperture 950B. This can improve the viewing angle of the display 900 and improve the tolerance for misalignment between the shutter 904B and the aperture 908B. In one implementation, the aperture 908B is widened to a lesser extent than depicted in FIG. 9, and the aperture 908B may be spaced away from and not extend under the shutter 904B, yet aperture 908B may still be wider and extended on the side of the aperture 908B proximate the shutter 904B when in its open positions.

Figure 10:
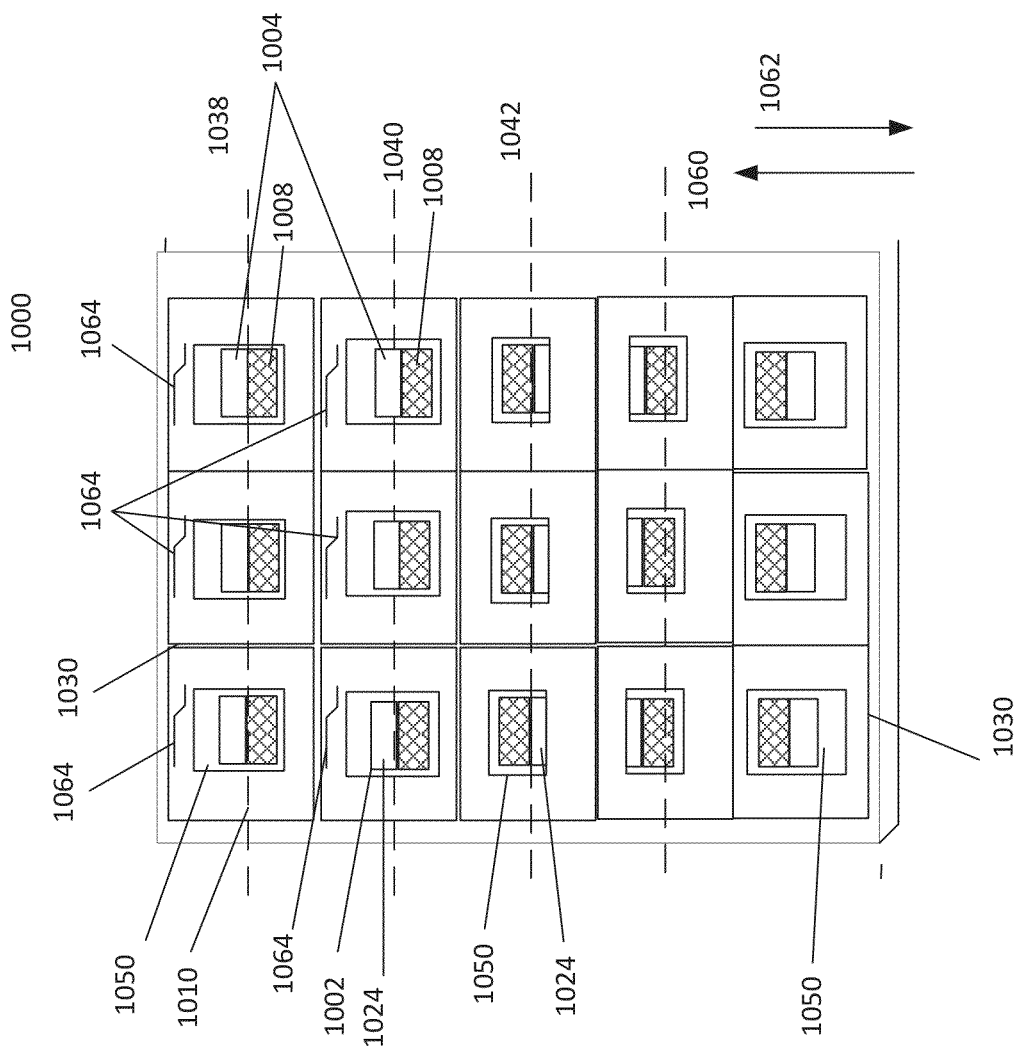
FIG. 10 depicts an overhead view of a plurality of apertures extending to terminal edges of shutter assemblies formed on a substrate.

FIG. 10 depicts an overhead view of a plurality of apertures extending to terminal edges of shutter assemblies formed on a substrate. FIG. 10 depicts a portion of a display 1000. The display 1000 includes a plurality of shutter assembly 1002. FIG. 10 presents the arrangement of shutter assemblies 1002 from an overhead plan view that shows an upper layer of material 1010 that defines the aperture 1050 to which light passes travelling towards the coverplate of the display, such as the coverplate 622 depicted in FIG. 6. FIG. 10 presents a plan view of the aperture 1050 that includes a single layer of material over one portion of the shutter assembly and which leaves opposing portion of the shutter assembly exposed as depicted by the cross-sectional view in FIG. 10. The aperture 1050 extends to substantially the terminal edge of the shutter assembly 1002 formed on the substrate 1030.

FIG. 10 further depicts that the shutter assemblies 1002 may be oriented in opposing directions. For example, FIG. 10 depicts that the shutter assembly 1002 in the row 1040 have shutters 1024 that move in a direction opposing the direction of travel of the shutters 1024 in row 1042. Similarly, the shutters 1004 in row 1038 travel across the aperture 1008 by moving in a direction that is opposing the direction of travel of the shutters 1004 in row 1046. It is understood that by alternating the orientation of the shutter assembly 1002, the benefits of the asymmetrically aligned shutters 1004 of providing improved viewing at high viewing angles is distributed across the display 1000 to improve high-angle viewing along multiple directions, including the direction of arrow 1060 and along direction of arrow 1062.

Figure 11A:
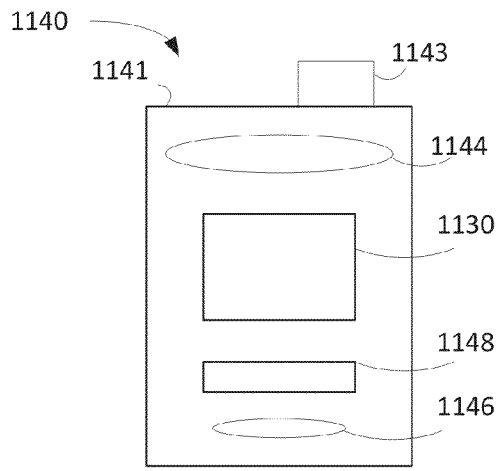
FIGS. 11A and 11B are system block diagrams illustrating a display device that includes a plurality of light modulator display elements.
Figure 11B:
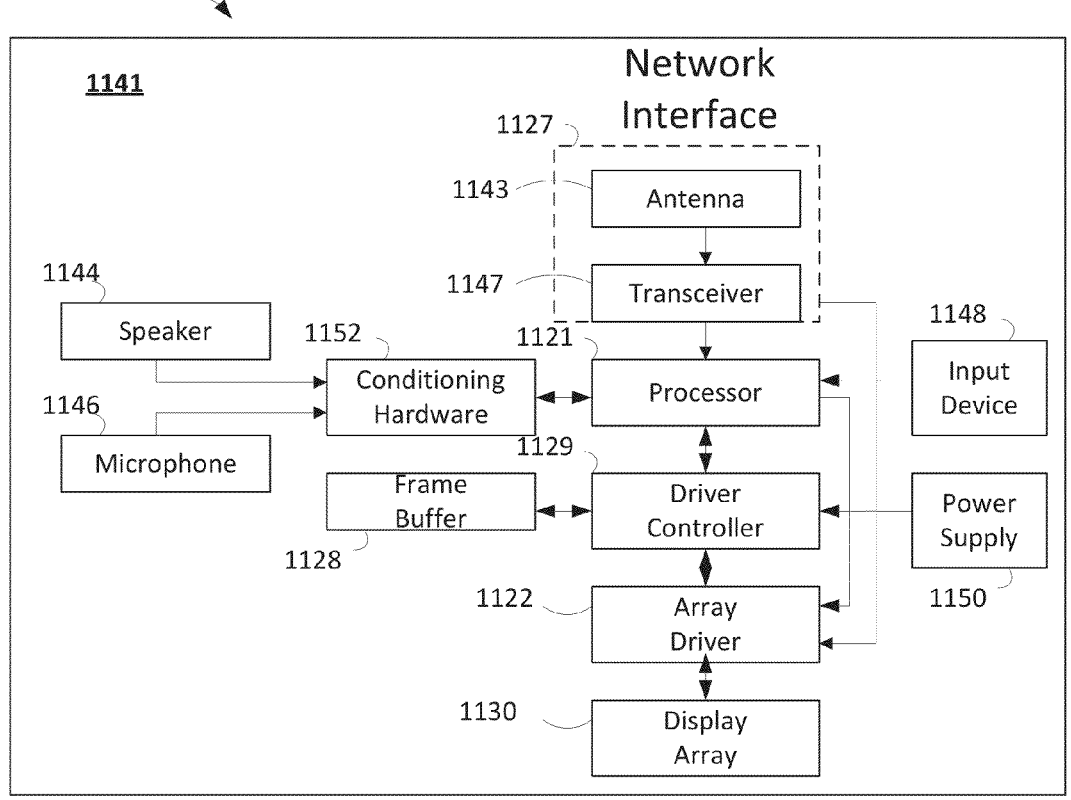

FIGS. 11A and 11B are system block diagrams illustrating a display device that includes a plurality of light modulator display elements. The display device 40 may include light modulators as described herein that, in certain implementations, have shutters that are asymmetrically aligned with an aperture when the shutter is positioned to block light from passing through the aperture. The display device 1140 can be, for example, a smart phone, a cellular or mobile telephone. However, the same components of the display device 1140 or slight variations thereof are also illustrative of various types of display devices such as televisions, computers, tablets, e-readers, hand-held devices and portable media devices.

The display device 1140 includes a housing 1141, a display 1130, an antenna 1143, a speaker 1144, an input device 1148 and a microphone 1146. The housing 1141 can be formed from any of a variety of manufacturing processes, including injection molding, and vacuum forming. In addition, the housing 1141 may be made from any of a variety of materials, including, but not limited to: plastic, metal, glass, rubber and ceramic, or a combination thereof. The housing 1141 can include removable portions (not shown) that may be interchanged with other removable portions of different color, or containing different logos, pictures, or symbols.

The display 1130 may be any of a variety of displays, including a bi-stable or analog display, as described herein. The display 1130 also can be configured to include a flat-panel display, such as plasma, EL, OLED, STN LCD, or TFT LCD, or a non-flat-panel display, such as a CRT or other tube device. In addition, the display 1130 can include an light modulator-based display, as described herein.

The components of the display device 1140 are schematically illustrated in FIG. 11A. The display device 1140 includes a housing 1141 and can include additional components at least partially enclosed therein. For example, the display device 1140 includes a network interface 1127 that includes an antenna 1143 which can be coupled to a transceiver 1147. The network interface 1127 may be a source for image data that could be displayed on the display device 1140. Accordingly, the network interface 1127 is one example of an image source module, but the processor 1121 and the input device 1148 also may serve as an image source module. The transceiver 1147 is connected to a processor 1121, which is connected to conditioning hardware 1152. The conditioning hardware 1152 may be configured to condition a signal (such as filter or otherwise manipulate a signal). The conditioning hardware 1152 can be connected to a speaker 1144 and a microphone 1146. The processor 1121 also can be connected to an input device 1148 and a driver controller

1129. The driver controller 1129 can be coupled to a frame buffer 1128, and to an array driver 1122, which in turn can be coupled to a display array 1130. One or more elements in the display device 1140, including elements not specifically depicted in FIG. 11A, can be configured to function as a memory device and be configured to communicate with the processor 1121. In some implementations, a power supply 1150 can provide power to substantially all components in the particular display device 1140 design.

The network interface 1127 includes the antenna 1143 and the transceiver 1147 so that the display device 1140 can communicate with one or more devices over a network. The network interface 1127 also may have some processing capabilities to relieve, for example, data processing requirements of the processor 1121. The antenna 1143 can transmit and receive signals. In some implementations, the antenna 1143 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 1143 transmits and receives RF signals according to the Bluetooth® standard. In the case of a cellular telephone, the antenna 1143 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 1147 can pre-process the signals received from the antenna 1143 so that they may be received by and further manipulated by the processor 1121. The transceiver 1147 also can process signals received from the processor 1121 so that they may be transmitted from the display device 1140 via the antenna 1143.

In some implementations, the transceiver 1147 can be replaced by a receiver. In addition, in some implementations, the network interface 1127 can be replaced by an image source, which can store or generate image data to be sent to the processor 1121. The processor 1121 can control the overall operation of the display device 1140. The processor 1121 receives data, such as compressed image data from the network interface 1127 or an image source, and processes the data into raw image data or into a format that can be readily processed into raw image data. The processor 1121 can send the processed data to the driver controller 1129 or to the frame buffer 1128 for storage. Raw data typically refers to information that identifies the image characteristics at each location within an image. For example, such image characteristics can include color, saturation and gray-scale level.

The processor 1121 can include a microcontroller, CPU, or logic unit to control operation of the display device 1140. The conditioning hardware 1152 may include amplifiers and filters for transmitting signals to the speaker 1144, and for receiving signals from the microphone 1146. The conditioning hardware 1152 may be discrete components within the display device 1140, or may be incorporated within the processor 1121 or other components.

The driver controller 1129 can take the raw image data generated by the processor 1121 either directly from the processor 1121 or from the frame buffer 1128 and can re-format the raw image data appropriately for high speed transmission to the array driver 1122. In some implementations, the driver controller 1129 can re-format the raw image data into a data flow having a raster-like format, such that it has a time order suitable for scanning across the display 1130. Then the driver controller 1129 sends the formatted information to the array driver 1122. Although a driver controller 1129, such as an LCD controller, is often associated with the system processor 1121 as a stand-alone Integrated Circuit (IC), such controllers may be implemented in many ways. For example, controllers may be embedded in the processor 1121 as hardware, embedded in the processor 1121 as software, or fully integrated in hardware with the array driver 1122.

The array driver 1122 can receive the formatted information from the driver controller 1129 and can re-format the video data into a parallel set of waveforms that are applied many times per second to the hundreds, and sometimes thousands (or more), of leads coming from the display's x-y matrix of display elements.

In some implementations, the driver controller 1129, the array driver 1122, and the display 1130 are appropriate for any of the types of displays described herein. For example, the driver controller 1129 can be a conventional display controller or a bi-stable display controller (such as a light modulator display element controller). Additionally, the array driver 1122 can be a conventional driver or a bi-stable display driver (such as a light modulator display element driver). Moreover, the display array 1130 can be a conventional display array or a bi-stable display array (such as a display including an array of light modulator display elements). In some implementations, the driver controller 1129 can be integrated with the array driver 1122. Such an implementation can be useful in highly integrated systems, for example, mobile phones, portable-electronic devices, watches or small-area displays.

In some implementations, the input device 1148 can be configured to allow, for example, a user to control the operation of the display device 1140. The input device 1148 can include a keypad, such as a QWERTY keyboard or a telephone keypad, a button, a switch, a rocker, a touch-sensitive screen, a touch-sensitive screen integrated with the display array 1130, or a pressure- or heat-sensitive membrane. The microphone 1146 can be configured as an input device for the display device 1140. In some implementations, voice commands through the microphone 1146 can be used for controlling operations of the display device 1140.

The power supply 1150 can include a variety of energy storage devices. For example, the power supply 1150 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 1150 also can be a renewable energy source, a capacitor, or a solar cell, including a plastic solar cell or solar-cell paint. The power supply 1150 also can be configured to receive power from a wall outlet.

In some implementations, control programmability resides in the driver controller 1129 which can be located in several places in the electronic display system. In some other implementations, control programmability resides in the array driver 1122. The above-described optimization may be implemented in any number of hardware and/or software components and in various configurations.

The systems, methods for display and methods of manufacturing disclosed herein extend beyond the examples described above, which are provided for illustration and not limiting. The systems and methods described herein may be used with any suitable light modulator, including but not limited to light modulators having a moveable shutter formed on a substrate having an aperture. Any modulator that can, in at least one position, asymmetrically align with a source of light to reduce the range of angles for off-axis to travel between the modulator and the aperture may include the systems and methods disclosed herein.

Accordingly, variations and modifications can be made to the implementations described above without substantially departing from the principles of the present application. Such variations and modifications are also intended to be included within the scope of the appended claims. Therefore, the forgoing implementations are to be considered in all respects illustrative, rather than limiting of the application.

The invention claimed is:

1. A display, comprising:
   a first layer having a first aperture with a first side spaced apart from a second side;
   a second layer having a second aperture; and
   a shutter for obstructing passage of light through the first aperture and having a first shutter edge spaced apart from a second shutter edge, and, in a first position, aligned with the first aperture so as to have the first shutter edge extending a length past the first side of the first aperture and the second shutter edge extending a second longer length past the second side of the first aperture, wherein:
   the shutter is interposed between the first layer and the second layer,
   the second aperture and the first aperture are at least partially coextensive with one another,
   the second aperture is wider than the first aperture in a direction perpendicular to the first shutter edge, and
   the shutter is wider than the first aperture in the direction perpendicular to the first shutter edge and wider than the second aperture in the direction perpendicular to the first shutter edge.

2. The display according to claim 1, further comprising an actuator for moving the shutter between the first position and a second position, wherein moving the shutter to the second position from the first position causes the first shutter edge to traverse the aperture.

3. The display according to claim 2, wherein the first position aligns the shutter with the first aperture so as to block passage of light through the first aperture and wherein the second position aligns the shutter with the first aperture so as to allow light to pass through the first aperture.

4. The display according to claim 1, wherein the second aperture extends further towards the second shutter edge than the first aperture.

5. The display according to claim 1, wherein a portion of the shutter extends across the first aperture when the shutter is in the second position.

6. The display according to claim 1, further comprising a light cavity, wherein the first layer is interposed between the light cavity and the shutter and the light cavity is arranged to pass light toward the aperture.

7. The display according to claim 1, wherein the first layer includes a plurality of apertures, each having a respective shutter and a respective actuator for moving the shutter between the first position and a second position.

8. The display according to claim 7, wherein at least two shutters of the plurality of shutters move in different directions of motion when transitioning from the first position to the second position.

9. The display according to claim 7, further comprising
   a processor that is configured to communicate with the display, the processor being configured to process image data, and
   a memory device that is configured to communicate with the processor.

10. The display according to claim 9, further comprising
    a driver circuit configured to send at least one signal to the display, and
    a controller configured to send at least a portion of the image data to the driver circuit.

11. The display according to claim 9, further comprising:
    an image source module configured to send the image data to the processor, wherein the image source module comprises at least one item selected from the group consisting of: a) a receiver, b) a transceiver, and c) a transmitter.

12. The display according to claim 9, further comprising:
    an input device configured to receive input data and to communicate the input data to the processor.

13. A method of manufacturing a display, comprising:
    providing a first layer having a first aperture with a first side spaced apart from a second side;
    providing a second layer having a second aperture;
    disposing, between the first layer and the second layer and proximate the first aperture, a moveable shutter having a first shutter edge spaced apart from a second shutter edge and being arranged for traversing a path proximate the aperture to a first position for obstructing passage of light through the first aperture, wherein the shutter is wider in a direction aligned with the path than the first aperture and wider in the direction aligned with the path than the second aperture; and
    aligning the shutter with the first aperture to have the first shutter edge extending a length past the first side of the first aperture and the second shutter edge extending a second longer length past the second side of the first aperture when the shutter is in the first position.

14. The method according to claim 13, further comprising providing an actuator for moving the shutter between the first position and a second position, wherein moving the shutter to the second position causes the first shutter edge to traverse the first aperture.

15. The method according to claim 13, wherein the second aperture extends further towards the second shutter edge than the first aperture.

16. The method according to claim 13, further comprising:
    forming the second aperture to extend across the shutter when the shutter is in the second position.

* * * * *